United States Patent
Bothe et al.

(10) Patent No.: US 12,015,075 B2
(45) Date of Patent: Jun. 18, 2024

(54) METHODS OF MANUFACTURING HIGH ELECTRON MOBILITY TRANSISTORS HAVING A MODIFIED INTERFACE REGION

(71) Applicant: Wolfspeed, Inc., Durham, NC (US)

(72) Inventors: Kyle Bothe, Cary, NC (US); Joshua Bisges, Wake Forest, NC (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 367 days.

(21) Appl. No.: 17/325,628

(22) Filed: May 20, 2021

(65) Prior Publication Data
US 2022/0376085 A1    Nov. 24, 2022

(51) Int. Cl.
| | | |
|---|---|---|
| H01L 29/66 | (2006.01) | |
| H01L 21/02 | (2006.01) | |
| H01L 21/265 | (2006.01) | |
| H01L 21/306 | (2006.01) | |
| H01L 21/324 | (2006.01) | |

(Continued)

(52) U.S. Cl.
CPC .. H01L 29/66462 (2013.01); H01L 21/30612 (2013.01); H01L 21/7605 (2013.01); H01L 29/2003 (2013.01); H01L 29/205 (2013.01); H01L 29/401 (2013.01); H01L 29/402 (2013.01); H01L 29/4175 (2013.01); H01L 29/7786 (2013.01); H01L 21/02252 (2013.01);

(Continued)

(58) Field of Classification Search
CPC ......... H01L 29/66462; H01L 21/30612; H01L 29/2003; H01L 29/205; H01L 29/7786; H01L 21/02252; H01L 21/26546; H01L 21/3245
See application file for complete search history.

(56) References Cited

U.S. PATENT DOCUMENTS

| | | |
|---|---|---|
| 4,946,547 A | 8/1990 | Palmour et al. |
| 5,192,987 A | 3/1993 | Khan et al. |

(Continued)

FOREIGN PATENT DOCUMENTS

| | | |
|---|---|---|
| CN | 104022151 A | 9/2014 |
| EP | 2852980 A1 | 4/2015 |

(Continued)

OTHER PUBLICATIONS

Hoshi et al. "Influence of NH3-plasma pretreatment before Si3N4 passivation film deposition on current collapse in AlGaN/GaN-HEMTs" IEICE Transactions on Electronics E89-C(7):1052-1056 (Jul. 2006).

(Continued)

*Primary Examiner* — Nduka E Ojeh
(74) *Attorney, Agent, or Firm* — Myers Bigel, P.A.

(57) ABSTRACT

A method of forming a high electron mobility transistor (HEMT) includes: providing a semiconductor structure comprising a channel layer and a barrier layer sequentially stacked on a substrate; forming a first insulating layer on the barrier layer; and forming a gate contact, a source contact, and a drain contact on the barrier layer. An interface between the first insulating layer and the barrier layer comprises a modified interface region on a drain access region and/or a source access region of the semiconductor structure such that a sheet resistance of the drain access region and/or the source access region is between 300 and 400 $\Omega$/sq.

21 Claims, 19 Drawing Sheets

(51) Int. Cl.
- *H01L 21/76* (2006.01)
- *H01L 29/20* (2006.01)
- *H01L 29/205* (2006.01)
- *H01L 29/40* (2006.01)
- *H01L 29/417* (2006.01)
- *H01L 29/778* (2006.01)

(52) U.S. Cl.
CPC .... *H01L 21/26546* (2013.01); *H01L 21/3245* (2013.01)

(56) References Cited

U.S. PATENT DOCUMENTS

| | | | |
|---|---|---|---|
| 5,200,022 | A | 4/1993 | Kong et al. |
| 5,210,051 | A | 5/1993 | Carter |
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter et al. |
| 6,316,793 | B1 | 11/2001 | Sheppard et al. |
| 6,548,333 | B2 | 4/2003 | Smith |
| 6,586,781 | B2 | 7/2003 | Wu et al. |
| 7,030,428 | B2 | 4/2006 | Saxler |
| 7,045,404 | B2 | 5/2006 | Sheppard et al. |
| 7,259,402 | B2 | 8/2007 | Edmond et al. |
| 7,291,529 | B2 | 11/2007 | Slater et al. |
| 7,544,963 | B2 | 6/2009 | Saxler |
| 7,548,112 | B2 | 6/2009 | Sheppard |
| 7,592,211 | B2 | 9/2009 | Sheppard et al. |
| 7,615,774 | B2 | 11/2009 | Saxler |
| 7,709,269 | B2 | 5/2010 | Smith et al. |
| 7,932,111 | B2 | 4/2011 | Edmond |
| 8,049,252 | B2 | 11/2011 | Smith et al. |
| 8,120,064 | B2 | 2/2012 | Parikh et al. |
| 8,513,686 | B2 | 8/2013 | Edmond |
| 8,563,372 | B2 | 10/2013 | Hagleitner et al. |
| 9,214,352 | B2 | 12/2015 | Hagleitner et al. |
| 10,971,612 | B2 | 4/2021 | Bothe et al. |
| 2003/0020092 | A1* | 1/2003 | Parikh ................ H01L 29/7783 257/E29.253 |
| 2004/0144991 | A1 | 7/2004 | Kikkawa |
| 2005/0258451 | A1* | 11/2005 | Saxler ............ H01L 29/66454 257/E21.406 |
| 2007/0194354 | A1 | 8/2007 | Wu et al. |
| 2009/0283756 | A1* | 11/2009 | Hellings .......... H01L 29/66462 257/E21.403 |
| 2010/0295100 | A1 | 11/2010 | Huang et al. |
| 2011/0057232 | A1* | 3/2011 | Sheppard ........... H01L 29/0843 257/E21.403 |
| 2014/0284613 | A1 | 9/2014 | Kuraguchi et al. |
| 2015/0035010 | A1* | 2/2015 | Takeuchi ........... H01L 21/0228 257/194 |
| 2016/0282289 | A1 | 9/2016 | Tanaka |
| 2017/0117132 | A1* | 4/2017 | Koyama .......... H01L 21/02274 |
| 2017/0330940 | A1* | 11/2017 | Lee .................. H01L 29/66462 |
| 2017/0352754 | A1* | 12/2017 | Beach ................ H01L 29/7787 |
| 2019/0385846 | A1 | 12/2019 | Fukuhara et al. |
| 2020/0119179 | A1 | 4/2020 | Mishra et al. |
| 2020/0395475 | A1 | 12/2020 | Bothe et al. |
| 2021/0111254 | A1* | 4/2021 | Jones ................. H01L 29/7786 |
| 2021/0118871 | A1 | 4/2021 | Piedra et al. |
| 2021/0257486 | A1 | 8/2021 | Wong |
| 2021/0384303 | A1 | 12/2021 | Zhang et al. |
| 2022/0223694 | A1* | 7/2022 | Kantarovsky ........ H01L 29/401 |

FOREIGN PATENT DOCUMENTS

| | | |
|---|---|---|
| JP | 2011077123 A | 4/2011 |
| JP | 2011238701 A | 11/2011 |

OTHER PUBLICATIONS

Notification of Transmittal of the International Search Report and the Written Opinion of the International Searching Authority, or the Declaration, in corresponding PCT Application No. PCT/US2022/029736 (Sep. 5, 2022).

Song et al. "Normally-off AlGaN/GaN Low-Density-Drain HEMTs (LDD-HEMT) with Enhanced Breakdown Voltage and Suppressed Current Collapse" Proceedings of the 19th International Symposium on Power Semiconductor Devices and IC's 28(3):189-191 (Mar. 2007).

* cited by examiner

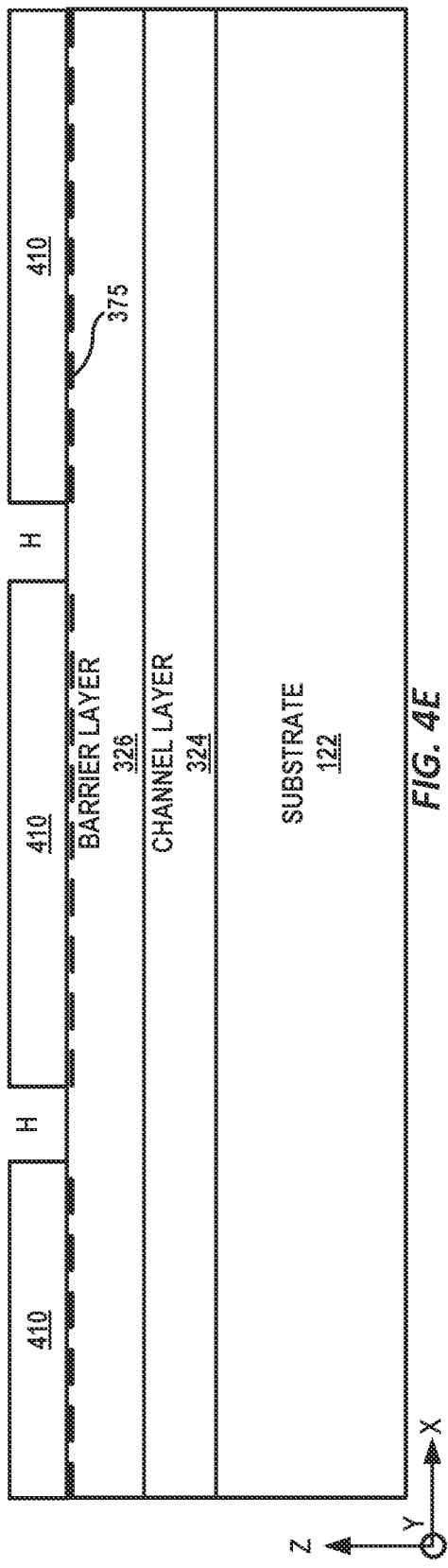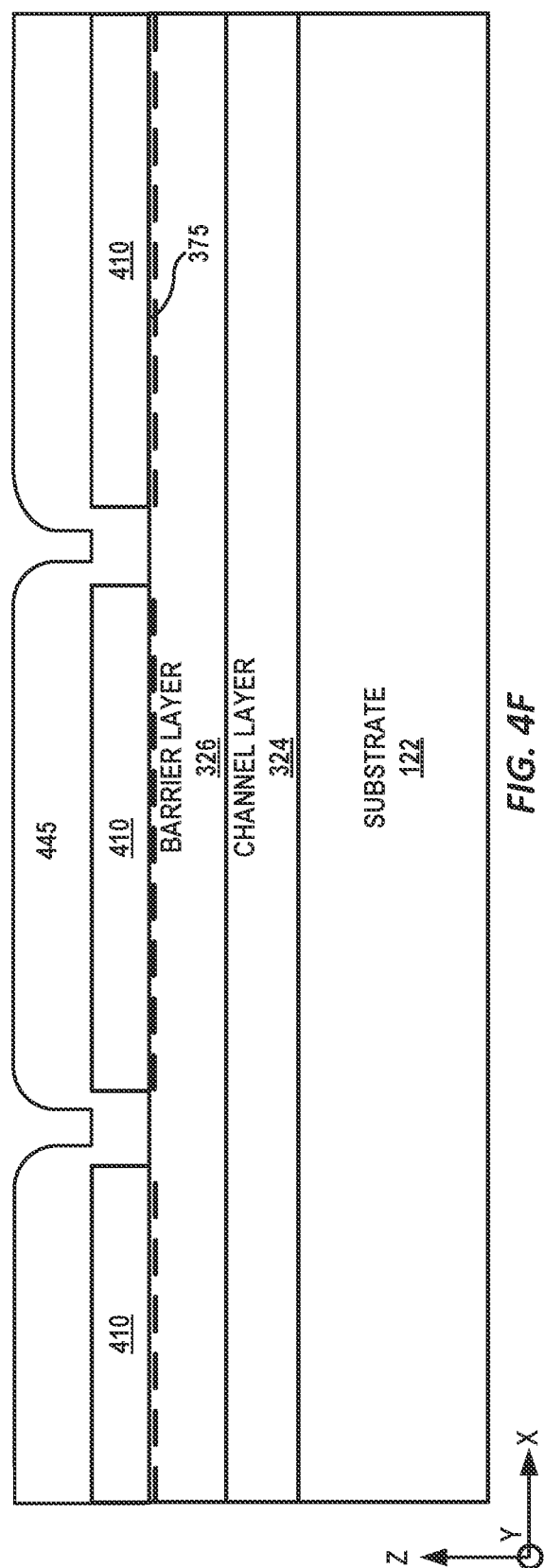

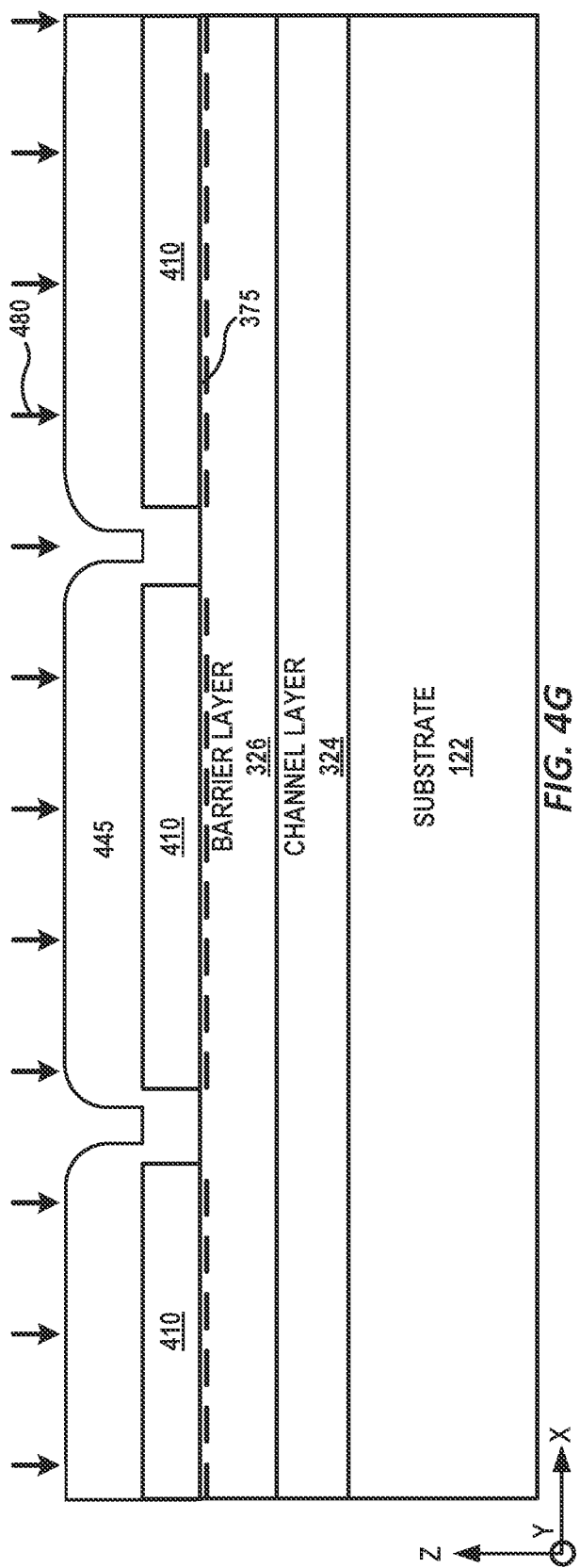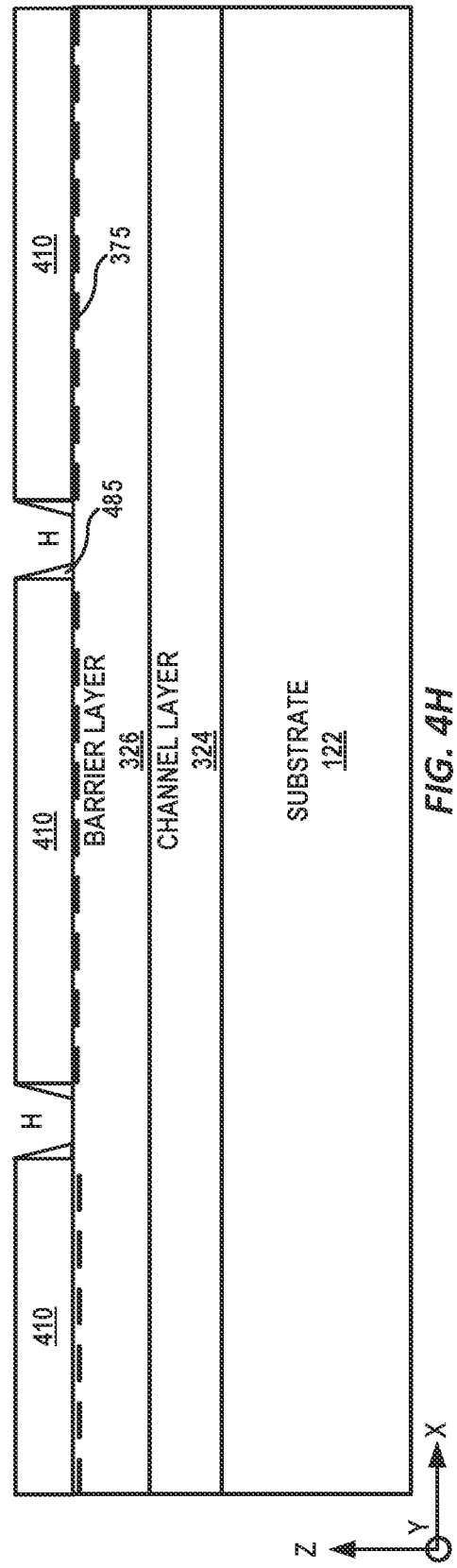

METHODS OF MANUFACTURING HIGH ELECTRON MOBILITY TRANSISTORS HAVING A MODIFIED INTERFACE REGION

FIELD

The inventive concepts described herein relate to semiconductor devices and, more particularly, to high electron mobility transistors.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

HEMT devices may offer operational advantages in a number of applications. In operation, a two-dimensional electron gas (2DEG) is formed in a HEMT device at the heterojunction of two semiconductor materials with different bandgap energies, where the smaller bandgap material has a higher electron affinity. The 2DEG is an accumulation layer in the smaller bandgap material and can contain a very high sheet electron concentration. Additionally, electrons that originate in the wider-bandgap semiconductor material transfer to the 2DEG layer, allowing a high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications.

High electron mobility transistors fabricated in Group III-nitride based material systems have the potential to generate large amounts of radio frequency (RF) power because of the combination of material characteristics that includes the aforementioned high breakdown fields, wide bandgaps, large conduction band offset, and/or high saturated electron drift velocity.

Thus, HEMT devices may be advantageously utilized in a power amplifier (PA). Power amplifiers, including power amplifiers utilizing HEMT devices, often experience a trade-off between output power and bandwidth. Internal inefficiencies, such as parasitic capacitances, can impact the switching speed of the device. Smaller transistor geometries can achieve higher operating frequencies, but the smaller dimensions may result in reduced current (and power) capacity. Improving operating characteristics of the amplifier may assist in efficiently using the bandwidth that is available.

SUMMARY

Embodiments described herein provide methods of forming improved HEMT devices and improved power amplifiers comprising such HEMT devices.

Pursuant to some embodiments of the present disclosure, a method of forming a high electron mobility transistor (HEMT) includes: providing a semiconductor structure comprising a channel layer and a barrier layer sequentially stacked on a substrate; forming a first insulating layer on the barrier layer; and forming a gate contact, a source contact, and a drain contact on the barrier layer. An interface between the first insulating layer and the barrier layer comprises a modified interface region on a drain access region and/or a source access region of the semiconductor structure such that a sheet resistance of the drain access region and/or the source access region is between 300 and 400 SI/sq.

In some embodiments, a bottom surface of the gate contact is laterally offset from the modified interface region by 10 to 400 nm.

In some embodiments, forming the first insulating layer on the barrier layer comprises a use of physical vapor deposition (PVD), plasma enhanced chemical vapor deposition (PECVD), atomic layer deposition (ALD), plasma enhanced atomic layer deposition (PEALD), and/or thermolytic deposition.

In some embodiments, the method further includes wet etching an upper surface of the barrier layer in an acidic and/or basic chemical bath prior to forming the first insulating layer.

In some embodiments, the method further includes, prior to forming the first insulating layer, performing an ion bombardment of the barrier layer, performing a plasma nitridation of the barrier layer, performing a plasma oxidation of the barrier layer, performing an H2 plasma treatment of the barrier layer, and/or annealing the barrier layer in a gas environment.

In some embodiments, the method further includes forming a spacer between the modified interface region and the gate contact.

In some embodiments, forming the spacer comprises: etching a hole in the first insulating layer; and forming the spacer on a sidewall of the hole and on the barrier layer, and forming the gate contact comprises forming at least a portion of the gate contact on a sidewall of the spacer in the hole.

In some embodiments, an interface between the spacer and the barrier layer comprises an interface characteristic that is different from the modified interface region.

Pursuant to some embodiments of the present disclosure, a method of forming a high electron mobility transistor (HEMT), includes: providing a semiconductor structure comprising a channel layer and a barrier layer sequentially stacked on a substrate; forming a first insulating layer on the barrier layer; forming a gate contact on the barrier layer, at least a portion of the gate contact within the first insulating layer; and providing a modified interface region between the first insulating layer and the barrier layer that is laterally separated from a bottom surface of the gate contact.

In some embodiments, the modified interface region is laterally separated from the bottom surface of the gate contact by 10 to 400 nm.

In some embodiments, the method further includes etching a hole in the first insulating layer; and forming a spacer on a sidewall of the hole and on the barrier layer, and forming the gate contact comprises forming at least a portion of the gate contact on a sidewall of the spacer in the hole In some embodiments, an interface between the spacer and the barrier layer comprises a trap concentration that is different from a trap concentration of the modified interface region.

In some embodiments, providing the modified interface region comprises, prior to forming the first insulating layer, wet etching an upper surface of the barrier layer in an acidic and/or basic chemical bath, performing an ion bombardment of the barrier layer, performing a plasma nitridation of the barrier layer, performing a plasma oxidation of the barrier layer, performing an H2 plasma treatment of the barrier layer, and/or annealing the barrier layer in a gas environment.

In some embodiments, a thickness of the first insulating layer is between 80 nm and 120 nm.

In some embodiments, a sheet resistance of a drain access region and/or a source access region of the semiconductor structure beneath the modified interface region is between 300 and 400 Ω/sq.

Pursuant to some embodiments of the present disclosure, a method of forming a high electron mobility transistor (HEMT) includes: providing a semiconductor structure comprising a channel layer on a substrate and a barrier layer on the channel layer; forming a first insulating layer on the barrier layer, the first insulating layer comprising a modified interface region in an interface between the first insulating layer and the barrier layer; forming a spacer on the barrier layer in an opening in the first insulating layer; and forming a gate contact on the barrier layer and the spacer in the opening in the first insulating layer.

In some embodiments, the method further includes thinning the substrate.

In some embodiments, a bottom corner of the gate contact is offset from the modified interface region by the spacer.

In some embodiments, a thickness of the first insulating layer is between 80 nm and 120 nm.

In some embodiments, a width of a bottom surface of the spacer that is adjacent the barrier layer is 10 to 400 nm.

In some embodiments, forming the first insulating layer comprising the modified interface region comprises: wet etching an upper surface of the barrier layer in an acidic and/or basic chemical bath, performing a buffered oxide etch (BOE) of the upper surface of the barrier layer, performing an ion bombardment of the barrier layer, performing a plasma nitridation of the barrier layer, performing a plasma oxidation of the barrier layer, performing an H2 plasma treatment of the barrier layer, and/or annealing the barrier layer in a gas environment; and depositing a passivation layer on the barrier layer.

In some embodiments, an interface between the spacer and the barrier layer comprises a trap concentration and/or surface potential that is different from a trap concentration and/or surface potential of the modified interface region.

DETAILED DESCRIPTION

Embodiments of the present inventive concepts are described more fully hereinafter with reference to the accompanying drawings, in which embodiments of the invention are shown. These inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the present disclosure are directed to high electron mobility transistors that may exhibit improved performance. In some embodiments, treatments may be provided to an interface between a passivation layer and a barrier layer in the source and drain access regions of a HEMT device to improve the interface states between the barrier layer and a passivation layer in those regions. The interface treatments may be offset from a gate of the device to further reduce leakage current and improve breakdown performance of the device. In some embodiments, methods to produce the device may self-align the gate and the gate offsets between the source and drain access regions having the interface treatments.

Figure 1:
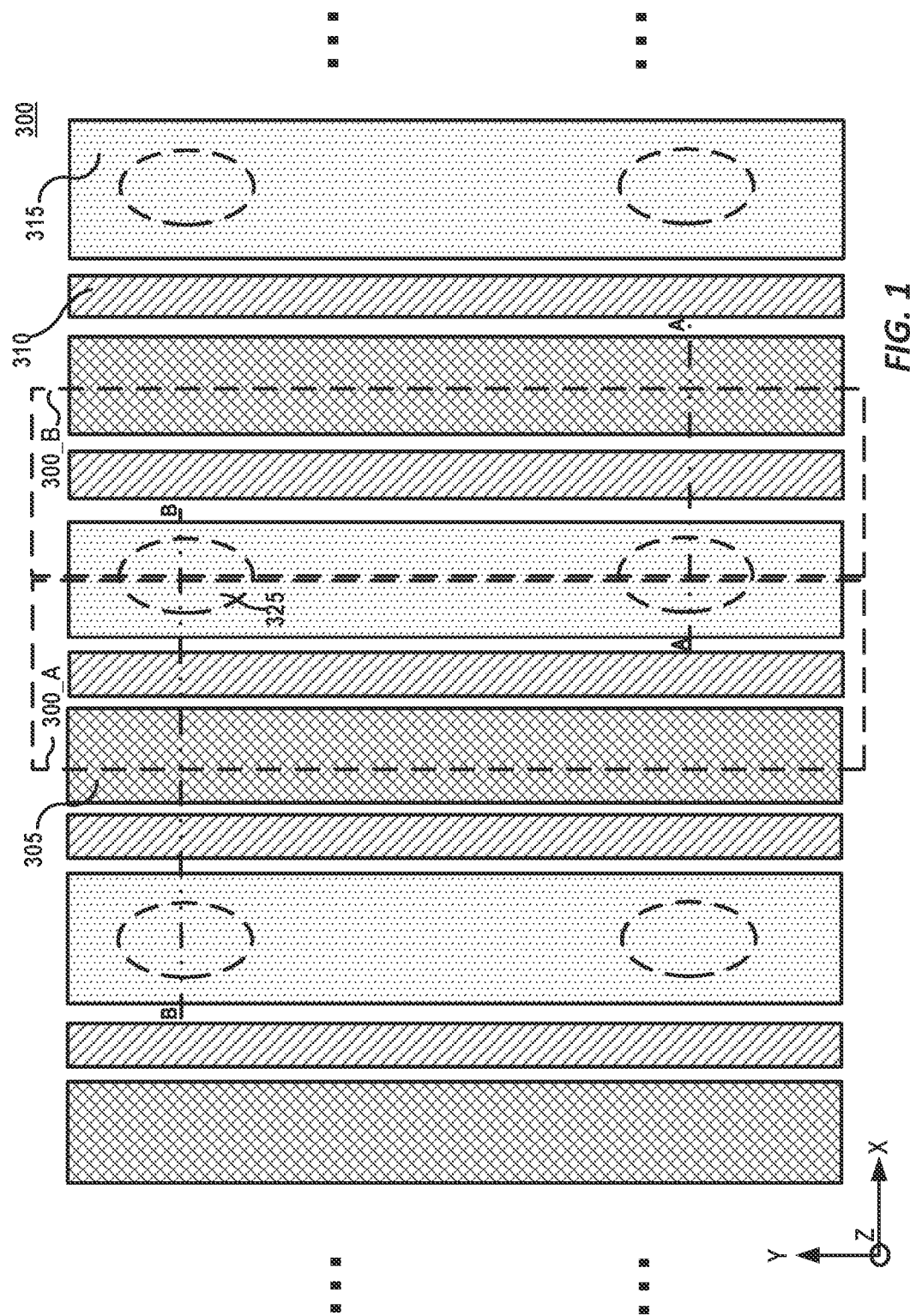
FIG. 1 is a schematic plan view of a high electron mobility transistor according to embodiments of the present disclosure.
Figure 2A:
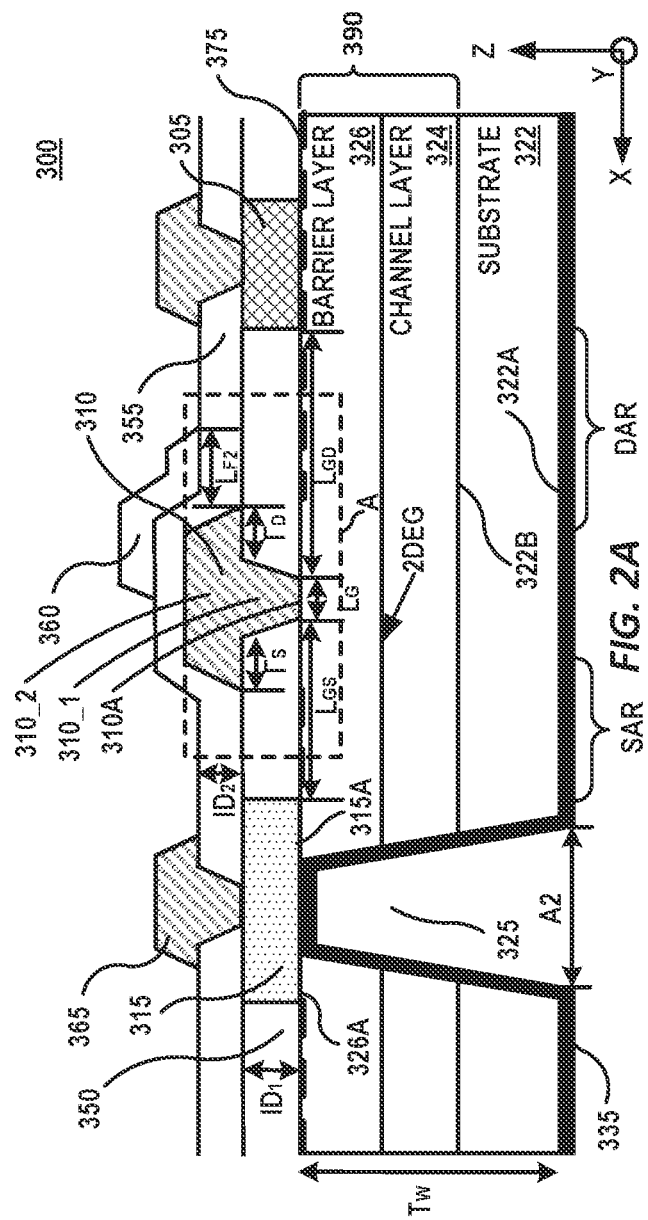
FIG. 2A is a schematic cross-sectional view taken along line A-A of FIG. 1.
Figure 2B:
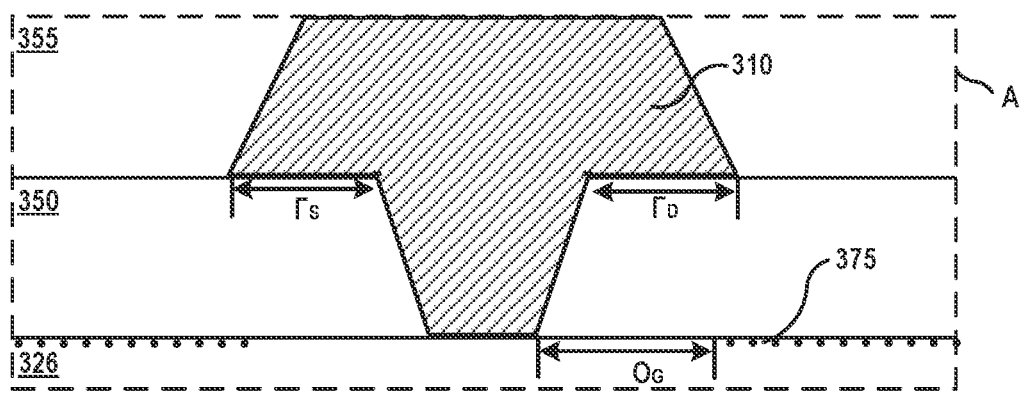
FIGS. 2B and 2C are detailed cross-sectional views of area A of FIG. 2A.
Figure 2C:
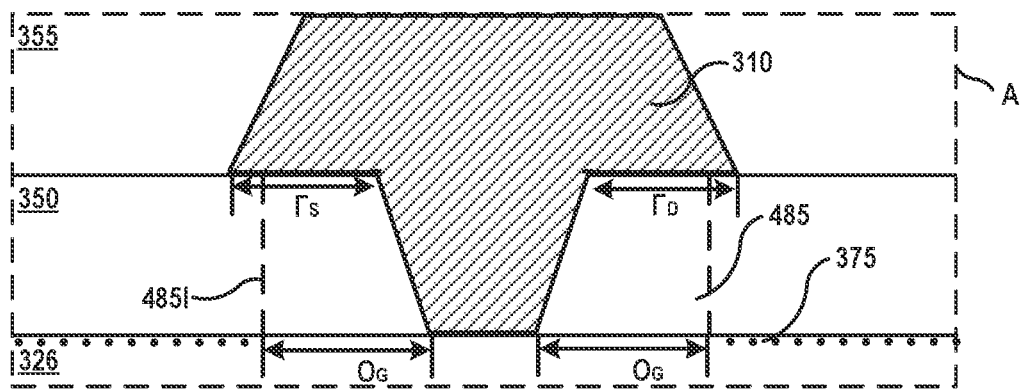

FIG. 1 is a schematic plan view of a HEMT device 300 according to embodiments of the present disclosure. FIG. 2A is a schematic cross-sectional view of the HEMT device 300 taken along line A-A of FIG. 1. FIGS. 2B and 2C are detailed cross-sectional views of area A of FIG. 2A. FIGS. 1 and 2A-2C are intended to represent structures for identification and description and are not intended to represent the structures to physical scale.

Referring to FIGS. 1 and 2A-2C, a semiconductor structure 390, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI)

substrate, available from Cree, Inc. The term "semi-insulating" is used descriptively herein, rather than in an absolute sense.

In some embodiments, the silicon carbide bulk crystal of the substrate 322 may have a resistivity equal to or higher than about $1 \times 10^5$ ohm-cm at room temperature. Example SiC substrates that may be used in some embodiments of the present disclosure are manufactured by, for example, Cree, Inc., of Durham, N.C., the assignee of the present disclosure, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a silicon carbide wafer, and the HEMT device 300 may be formed, at least in part, via wafer-level processing, and the wafer may then be diced to provide a plurality of individual high electron mobility transistors 300.

The substrate 322 may have a lower surface 322A and an upper surface 322B. In some embodiments, the substrate 322 of the HEMT device 300 may be a thinned substrate 322. In some embodiments, the thickness of the substrate 322 (e.g., in a vertical Z direction in FIG. 2A) may be 100 μm or less. In some embodiments, the thickness of the substrate 322 may be 75 μm or less. In some embodiments, the thickness of the substrate 322 may be 50 μm or less.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials. In some embodiments, a thickness of the wafer Tw (e.g., the thickness of the substrate 322, the channel layer 324, and the barrier layer 326) may be between 40 μm to about 100 μm. In some embodiments, the wafer thickness Tw may be between 40 μm to about 80 μm. In some embodiments, the wafer thickness Tw may be approximately 75 μm. Reducing the wafer thickness Tw may allow for the formation of a via 325 with a smaller cross-section, which may reduce the overall size of the device 300 and reduce inductance. In some embodiments, a largest cross-sectional area A2 of the via 325 is 1000 μm² or less.

In some embodiments, the channel layer 324 may be a Group III nitride, such as $Al_xGa_{1-x}N$, where $0 \le x < 1$, provided that the energy of the conduction band edge of the channel layer 324 is less than the energy of the conduction band edge of the barrier layer 326 at the interface between the channel and barrier layers 324, 326. In certain embodiments of the present disclosure, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 μm.

The channel layer 324 may also be a multi-layer structure, such as a superlattice or combinations of GaN, AlGaN or the like. The channel layer 324 may be under compressive strain in some embodiments.

In some embodiments, the barrier layer 326 is AlN, AlInN, AlGaN or AlInGaN or combinations of layers thereof. The barrier layer 326 may comprise a single layer or may be a multi-layer structure. In some embodiments, the barrier layer 326 may be a thin AlN layer directly on the channel layer 324 and a single AlGaN or multiple layers thereon. In particular embodiments of the present disclosure, the barrier layer 326 may be thick enough and may have a high enough aluminum (Al) composition and doping to induce a significant carrier concentration at the interface between the channel layer 324 and the barrier layer 326 through polarization effects when the barrier layer 326 is buried under ohmic contact metal. The barrier layer 326 may, for example, be from about 0.1 nm to about 30 nm thick, but is not so thick as to cause cracking or substantial defect formation therein. In some embodiments, the thickness of the barrier layer is between 13 and 18 nm. In certain embodiments, the barrier layer 326 is undoped or doped with an n-type dopant to a concentration less than about $10^{19}$ cm$^{-3}$. In some embodiments, the barrier layer 326 is $Al_xGa_{1-x}N$ where $0 < x < 1$. In particular embodiments, the aluminum concentration is about 25%. However, in other embodiments of the present disclosure, the barrier layer 326 comprises AlGaN with an aluminum concentration of between about 5% and less than about 100%. In specific embodiments of the present disclosure, the aluminum concentration is greater than about 10%. The channel layer 324 and/or the barrier layer 326 may be deposited, for example, by metal-organic chemical vapor deposition (MOCVD), molecular beam epitaxy (MBE), or hydride vapor phase epitaxy (HYPE). As discussed herein, a 2DEG layer is induced in the channel layer 324 at a junction between the channel layer 324 and the barrier layer 326. The 2DEG layer acts as a highly conductive layer that allows conduction between the source and drain regions of the device that are beneath a source contact 315 and a drain contact 305, respectively. The channel layer 324 and the barrier layer 326 form the semiconductor structure 390.

While semiconductor structure 390 is shown with channel layer 324 and barrier layer 326 for purposes of illustration, semiconductor structure 390 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 322B of the substrate 322 to provide an appropriate crystal structure transition between the silicon carbide substrate 322 and the remainder of the HEMT device 300. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 315 and a drain contact 305 may be formed on an upper surface 326A of the barrier layer 326 and may be laterally spaced apart from each other. A gate contact 310 may be formed on the upper surface 326A of the barrier layer 326 between the source contact 315 and the drain contact 305. The material of the gate contact 310 may be chosen based on the composition of the barrier layer 326, and may, in some embodiments, be a Schottky contact. Conventional materials capable of making a Schottky contact to a gallium nitride based semiconductor material may be used, such as, for example, nickel (Ni), platinum (Pt), nickel silicide ($NiSi_x$), copper (Cu), palladium (Pd), chromium (Cr), tungsten (W) and/or tungsten silicon nitride (WSiN).

The source contact 315 and the drain contact 305 may include a metal that can form an ohmic contact to a gallium nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), $NiSi_x$, titanium silicide (TiSi), titanium nitride (TiN), WSiN, Pt and the like. In some embodiments, the source contact 315 may be an ohmic source contact 315. Thus, the source contact 315 and the drain contact 305 may contain an ohmic contact portion in direct contact with the barrier layer 326. In some embodiments, the source contact 315 and/or drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

The source contact 315 may be coupled to a reference signal such as, for example, a ground voltage. The coupling to the reference signal may be provided by a via 325 that extends from the lower surface 322A of the substrate 322, through the substrate 322 to an upper surface 326A of the barrier layer. The via 325 may expose a bottom surface of the ohmic portion 315A of the source contact 315. A backmetal layer 335 may be formed on the lower surface 322A of the substrate 322 and on side walls of the via 325. The backmetal layer 335 may directly contact the ohmic portion 315A of the source contact 315. In some embodiments a contact area between the backmetal layer 335 and the bottom surface of the ohmic portion 315A of the source contact 315 may be fifty percent or more of an area of the bottom surface of the ohmic portion 315A of the source contact 315. Thus, the backmetal layer 335, and a signal coupled thereto, may be electrically connected to the source contact 315.

In some embodiments, the source contact 315, the drain contact 305, and the gate contact 310 may be formed as a plurality of source contacts 315, drain contacts 305, and gate contacts 310 on the substrate 322. Referring to FIG. 1, a plurality of drain contacts 305 and source contacts 315 may be alternately arranged on the substrate 322. A gate contact 310 may be disposed between adjacent drain contacts 305 and source contacts 315 to form a plurality of transistor unit cells, examples of which are designated as 300_A and 300_B in FIG. 1. Respective ones of the transistor unit cells 300_A, 300_B may include a source contact 315, a drain contact 305, and a gate contact 310. FIG. 1 illustrates a subset of the source contacts 315, drain contacts 305, and gate contacts 310 for ease of discussion, but it will be understood that the HEMT device 300 may have additional structures, including additional source contacts 315, drain contacts 305, and gate contacts 310, that are not illustrated in FIG. 1. As will be understood by one of ordinary skill in the art, a HEMT transistor may be formed by the active region between the source contact 315 and the drain contact 305 under the control of a gate contact 310 between the source contact 315 and the drain contact 305.

Referring to FIG. 2B, a first insulating layer 350 may be formed on the barrier layer 326 and a second insulating layer 355 may be formed on the first insulating layer 350. A thickness ID1 of the first insulating layer 350 may be between 80 nm and 120 nm. In some embodiments, the thickness ID1 of the first insulating layer 350 may be approximately 100 nm. In some embodiments, the first insulating layer 350 may include silicon nitride ($Si_xN_y$), aluminum nitride (AlN), silicon dioxide ($SiO_2$), and/or other suitable protective material. A thickness ID2 of the second insulating layer 355 may be between 190 nm and 230 nm. In some embodiments, the thickness ID2 of the second insulating layer 355 may be approximately 210 nm. In some embodiments, the first insulating layer 350 and the second insulating layer 355 may have a combined thickness of approximately 310 nm. The thickness of the first insulating layer 350 may affect the gate-to-source capacitance and the gate-to-drain capacitance, which can impact the switching speed of the device 300. Similarly, the thickness of the second insulating layer 355 may affect gate-to-drain capacitance, which can impact the switching speed and gain of the device 300.

A gate contact 310 may be formed in the first insulating layer 350, portions of which may be under the second insulating layer 355. It will be understood that the present invention is not limited to a particular shape of the gate contact 310 illustrated in FIGS. 2A and 2B, and that other shapes of the gate contact 310, as well as the other elements of the device 300, are possible without deviating from the embodiments described herein.

The gate contact 310 may include a first portion 310_1 within the first insulating layer 350 and a second portion 310_2, on the first portion 310_1, that is in the second insulating layer 355. A width of the second portion 310_2 of the gate contact 310 may exceed that of the first portion 310_1. In some embodiments, the second portion 310_2 of the gate contact 310 may extend beyond one or more sidewalls of the first portion 310_1 of the gate contact 310, such that the gate contact 310 forms a T-shaped gate and/or a gamma gate. On the drain side of the gate contact 310, the second portion 310_2 of the gate contact 310 may extend beyond a sidewall of the first portion 310_1 of the gate contact 310 towards the drain contact 305 by a first distance $F_D$. The distance $\Gamma'_D$ may be between 0.05 μm and 0.15 μm. In some embodiments, $\Gamma_D$ may be approximately 0.1 μm. On the source side of the gate contact 310, the second portion 310_2 of the gate contact 310 may extend beyond a sidewall of the first portion 310_1 of the gate contact 310 towards the source contact 315 by a second distance $\Gamma_S$. The distance $\Gamma_S$ may be between 0.05 μm and 0.15 μm. In some embodiments, $\Gamma_S$ may be approximately 0.1 μm. The first distance $\Gamma_D$ may affect gate-to-drain capacitance of the device 300, which can impact the switching speed and gain of the device 300. The second distance $\Gamma_S$ may affect gate-to-source capacitance of the device 300, which can impact the switching speed of the device 300.

The first portion 310_1 of the gate contact 310 may include a lower surface 310A adjacent the barrier layer 326. A length of the lower surface 310A of the gate contact 310, designated as $L_G$ in FIG. 2A, may be between 50 nm and 400 nm. In some embodiments, $L_G$ may be between 120 nm and 180 nm. In some embodiments, $L_G$ may be approximately 150 nm. The length $L_G$ may represent a length of an interface between the gate contact 310 and the barrier layer 326. The length $L_G$ may affect transconductance and gate parasitics which may impact switching and efficiency of the device 300. A side and/or edge of the lower surface 310A of the gate contact 310 that is closest to the drain contact 305 may be separated from the edge (e.g., the closest edge) of the drain contact 305 by a distance $L_{GD}$, as illustrated in FIG. 2A. The distance $L_{GD}$ between the lower surface 310A of the gate contact 310 and the drain contact 305 may be between 1.75 µm and 2.25 µm. In some embodiments, $L_{GD}$ may be approximately 1.98 µm. A side and/or edge of the lower surface 310A of the gate contact 310 that is closest to the source contact 315 may be separated from the edge (e.g., the closest edge) of the source contact 315 by a distance $L_{GS}$, as illustrated in FIG. 13. The distance $L_{GS}$ between the lower surface 310A of the gate contact 310 and the source contact 315 may be between 0.5 µm and 0.7 µm. In some embodiments, $L_{GS}$ may be approximately 0.6 µm. The distances $L_{GD}$ and $L_{GS}$ may contribute to the on-resistance of the device 300, which may impact the device efficiency. In some embodiments, the gate contact 310 may be closer to the source contact 315 than the drain contact 305.

The source contact 315, the drain contact 305, and the gate contact 310 may be formed in the first insulating layer 350. In some embodiments, at least a portion of the gate contact 310 may be on the first insulating layer. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 305, gate contact 310, and source contact 315.

An interface between the first insulating layer 350 and the barrier layer 326 may include physical characteristics as a result of an interface treatment and/or process used to improve the quality of the interface. A source access region SAR of the device 300 may include portions of the semiconductor structure 390 that are between the gate contact 310 and the source contact 315. Similarly, a drain access region DAR of the device 300 may include portions of the semiconductor structure 390 that are between the gate contact 310 and the drain contact 305. As will be discussed further herein, a modified interface region 375 may be provided, in part, within and/or on the source and drain access regions SAR, DAR so as to provide a non-uniform variation in conductivity, trap concentration, sheet resistance, and/or surface potential in the lateral direction (e.g., the X direction in FIG. 2A and/or a direction that is parallel to the upper surface 326A of the barrier layer 326) between the gate contact 310 and the drain contact 305 (or source contact 315). In some embodiments, the modified interface region 375 may include physical alterations to the interface between the first insulating layer 350 and the barrier layer 326 to, for example, reduce a trap concentration or otherwise improve an electrical property of the interface. The modifications to the interface between the first insulating layer 350 and the barrier layer 326 may affect the area in and/or around the interface. In addition, the modifications to the interface between the first insulating layer 350 and the barrier layer 326 may also affect the 2DEG induced in the channel layer 324 at the junction between the channel layer 324 and the barrier layer 326. For example, as a result of the modified interface region 375, a sheet resistance of the source access region SAR and/or the drain access region DAR of the device 300 (e.g., the device 2DEG channel induced in the channel layer 324 at the junction between the channel layer 324 and the barrier layer 326) may be between 300 to 400 SZ/sq.

Referring to FIG. 2B, the modified interface region 375 may be separated (e.g., laterally offset) from the lower surface 310A of the gate contact 310 by an offset $O_G$. Stated another way, the modified interface region 375 may be absent from the interface between the first insulating layer 350 and the barrier layer 326 within an offset $O_G$ from the lower surface 310A of the gate contact 310. The offset $O_G$ may be from 10 nm to 400 nm. The presence of the modified interface region 375 may improve a conductivity and/or sheet resistance of the active region of the device 300 so as to improve performance of the device. However, the same characteristics that may improve the performance of the device when present in the source access region SAR and/or drain access region DAR may cause a leakage current to exist if placed too near the gate contact 310. An increased leakage current may reduce the breakdown performance and/or reliability of the device 300. By distancing the modified interface region 375 from the lower surface 310A of the gate contact 310 by an offset $O_G$, the device 300 may have the benefits of the improved surface and drain access regions SAR, DAR while avoiding an increase in leakage current. Methods for providing the modified interface region 375 and the offset $O_G$ will be discussed further herein.

In some embodiments, the area between the modified interface region 375 and the gate contact 310 (e.g., the area of the interface between the first insulating layer 350 and the barrier layer 326 within the offset $O_G$ from the gate contact 310) may be free of an interface modification, or may have a different interface modification than the modified interface region 375. Stated another way, an interface modification made between the first insulating layer 350 and the barrier layer 326 adjacent the gate contact 310 may be different from the modified interface region 375 over the drain access region DAR and/or over the source access region SAR.

As will be discussed further herein, in some embodiments, the offset $O_G$ from the gate contact 310 may be provided by a spacer 485. Such an embodiment is illustrated in FIG. 2C. As shown in FIG. 2C, the spacer 485 may be located between the first insulating layer 350 and the bottom surface and/or bottom corner of the gate contact 310. The spacer 485 may be formed of a same material as the first insulating layer 350, but the embodiments of the present disclosure are not limited thereto. In some embodiments, the spacer 485 may be formed of a material that is different from the material of the first insulating layer 350. However, even if formed of a same material, an interface 485I may exist between the first insulating layer 350 and the spacer 485 (e.g., as a result of the processes used to form the spacer 485). As discussed above, in some embodiments, the spacer 485 may have its own interface modification between spacer 485 and the barrier layer 326. In some embodiments, the interface modification between the spacer 485 and the barrier layer 326 may be different than the modified interface region 375 between the first insulating layer 350 and the barrier layer 326. For example, in some embodiments, a trap concentration at the interface between the spacer 485 and the barrier layer 326 may be different than a trap concentration at the interface between the first insulating layer 350 and the barrier layer 326.

In some embodiments, the gate contact 310 may be self-aligned within the modified interface region 375. Stated another way, the gate contact 310 may be positioned such that the offset $O_G$ between the gate contact 310 and the modified interface region 375 on the drain side of the device 310 is substantially the same as the offset $O_G$ between the gate contact 310 and the modified interface region 375 on the source side of the device 310. In some embodiments, the symmetric spacing of the $O_G$ provided by the self-alignment of the gate contact 310 may allow the use a reduced and/or minimal distancing between the modified interface region 375 and the gate contact 310 allows for an increase and/or maximization of a percentage of the channel that has the modified interface state.

Referring back to FIG. 2A, field plates 360 may be formed on the second insulating layer 355. At least a portion of a field plate 360 may be on the gate contact 310. At least a portion of the field plate 360 may be on a portion of the second insulating layer 355 that is between the gate contact 310 and the drain contact 305. The field plate 360 can reduce the peak electric field in the HEMT device 300, which can result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is hereby incorporated herein in its entirety by reference.

On the drain side of the gate contact 310, the field plate 360 may extend beyond a sidewall of the second portion 310_2 of the gate contact 310 towards the drain contact 305, as illustrated in FIG. 2A, by a distance $L_{F2}$. In some embodiments, the distance $L_{F2}$ may refer to a distance by which the field plate 360 extends beyond an outermost portion of the second portion 310_2 of the gate contact 310 that is closest to the drain contact 305. The distance $L_{F2}$ may be between 0.3 µm and 0.5 µm. In some embodiments, $L_{F2}$ may be approximately 0.4 µm. The extension distance $L_{F2}$ of the field plate 360 beyond the gate contact 310 may affect the gate-to-source capacitance and the breakdown voltage of the device 300, which may impact the voltage rating and switching speed of the device 300.

Metal contacts 365 may be disposed in the second insulating layer 355. The metal contacts 365 may provide interconnection between the drain contact 305, gate contact 310, and source contact 315 and other parts of the HEMT device 300. Respective ones of the metal contacts 365 may directly contact respective ones of the drain contact 305 and/or source contact 315. The metal contacts 365 may contain metal or other highly conductive material, including, for example, copper, cobalt, gold, and/or a composite metal. For ease of illustration, the second insulating layer 355, the field plates 360, and the metal contacts 365 are not illustrated in FIG. 1.

One or more of the dimensions discussed with respect to FIGS. 1 and 2A-2C may contribute to an improvement of the device 300. In some embodiments, the configuration of the device 300 may allow the device to achieve the performance and improvements over conventional devices. For example, the embodiments described herein provide an optically-defined sub-200 nm (e.g., 120 nm to 200 nm) GaN HEMT technology that has improved RF and reliability performance. For example, embodiments provided herein may have an output power density at an operating frequency of 30 GHz that is greater than or equal to 4.6 W/mm. In some embodiments, the output power density at 30 GHz that is between 4.6 W/mm and 4.8 W/mm. Embodiments provided herein may have a peak Power Added Efficiency (PAE) that is greater than 33% at an operating frequency of 30 GHz. In some embodiments, the peak Power Added Efficiency (PAE) may be between 33% and 38% at an operating frequency of 30 GHz.

Figure 3A:
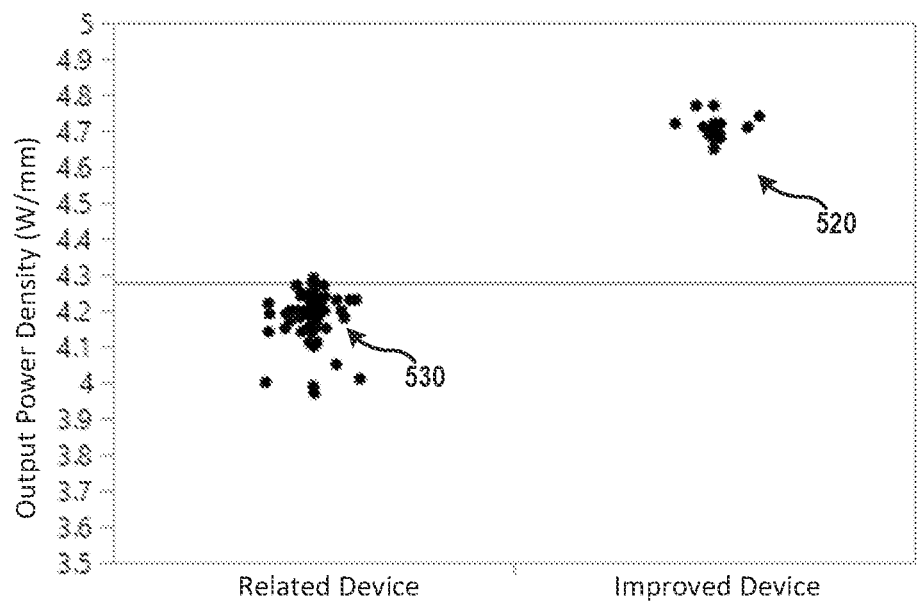
FIG. 3A is a graph of power density characteristics of devices according to embodiments described herein.
Figure 3B:
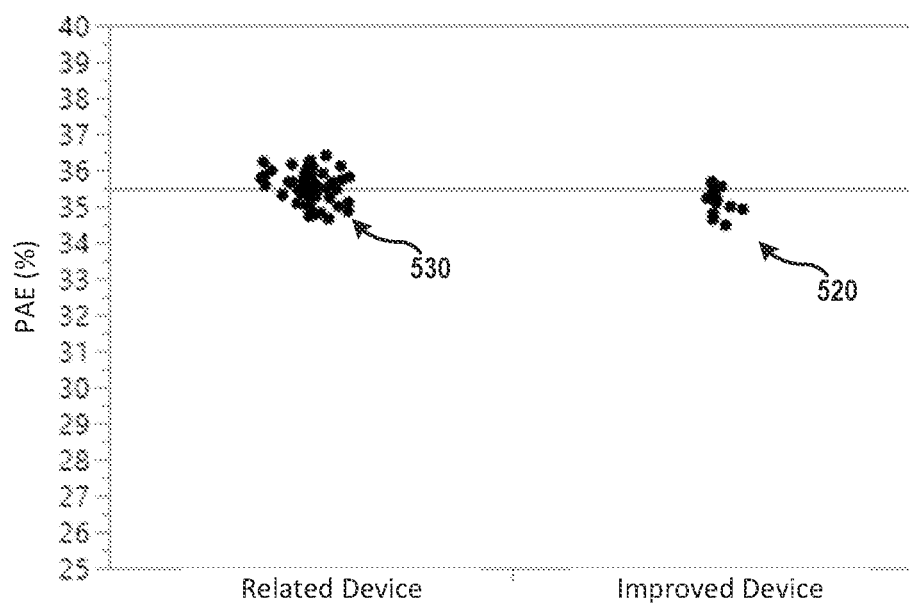
FIG. 3B is a graph of power added efficiency (PAE) characteristics of devices according to embodiments described herein.
Figure 3C:
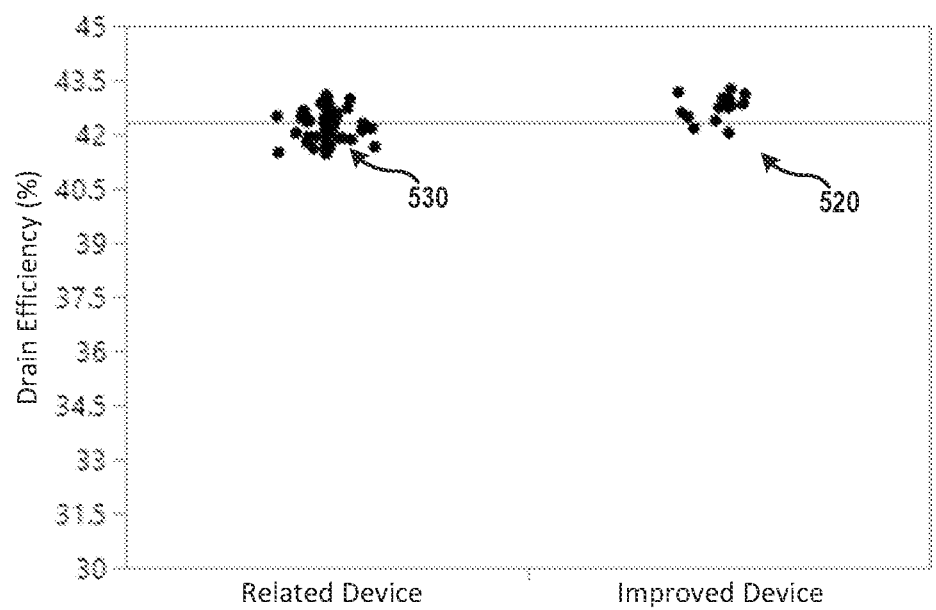
FIG. 3C is a graph of drain efficiency characteristics of devices according to embodiments described herein.

FIG. 3A is a graph of power density characteristics of devices according to embodiments described herein. FIG. 3B is a graph of power added efficiency (PAE) characteristics of devices according to embodiments described herein. FIG. 3C is a graph of drain efficiency characteristics of devices according to embodiments described herein.

FIG. 3A illustrates the output power density of a sample of devices 520 fabricated according to embodiments of the present disclosure ("Improved Device") as compared to a sample of unimproved devices 530 ("Related Device"). As shown in FIG. 3A, embodiments of the present disclosure exhibit a significant improvement in power density, with samples 520 showing power density values ranging from 4.6 to 4.8 W/mm as compared to the samples 530 related device having a maximum power density of approximately 4.3 W/mm. As illustrated in FIGS. 3B and 3C, the sample of devices 520 fabricated according to embodiments of the present disclosure ("Improved Device") illustrate a comparable PAE (FIG. 3B) and drain efficiency (FIG. 3C) to the sample of unimproved devices 530 ("Related Device"). Thus, HEMT devices according to embodiments of the present disclosure may increase an output power density of the device while maintaining the PAE and drain efficiency of the device. Embodiments of the present disclosure may provide improved parasitic capacitance, trapping and power density for high frequency applications.

Figure 4A:
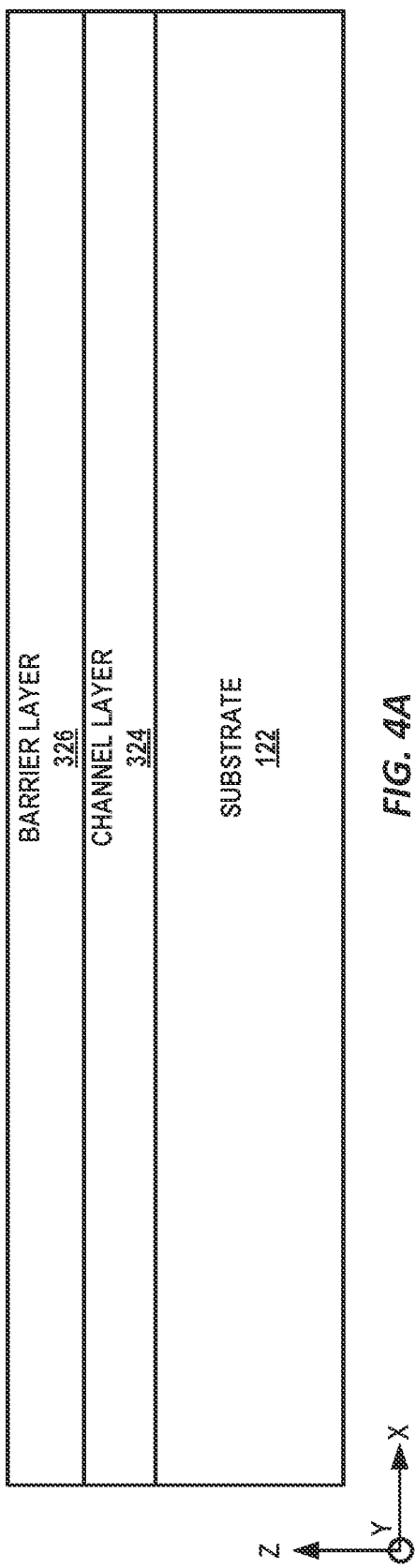
FIGS. 4A to 4Q are schematic cross-sectional views taken along line B-B of FIG. 1 that illustrate a method of fabricating a HEMT device, according to embodiments of the present disclosure.
Figure 4B:
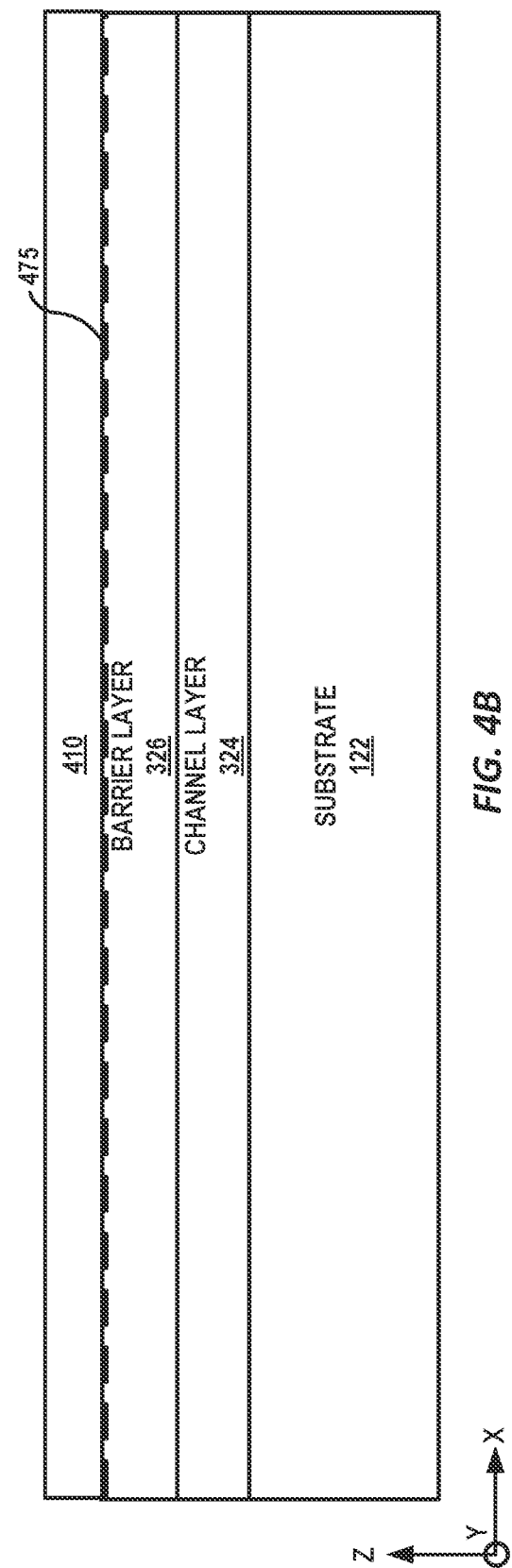
Figure 4C:
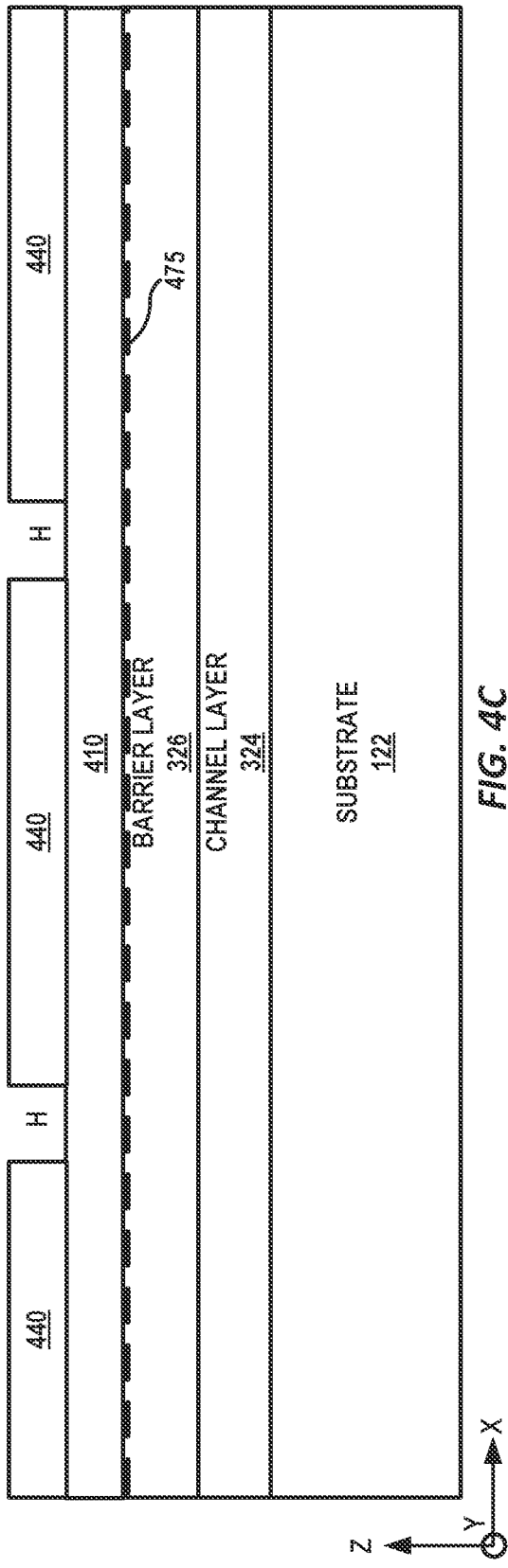
Figure 4D:
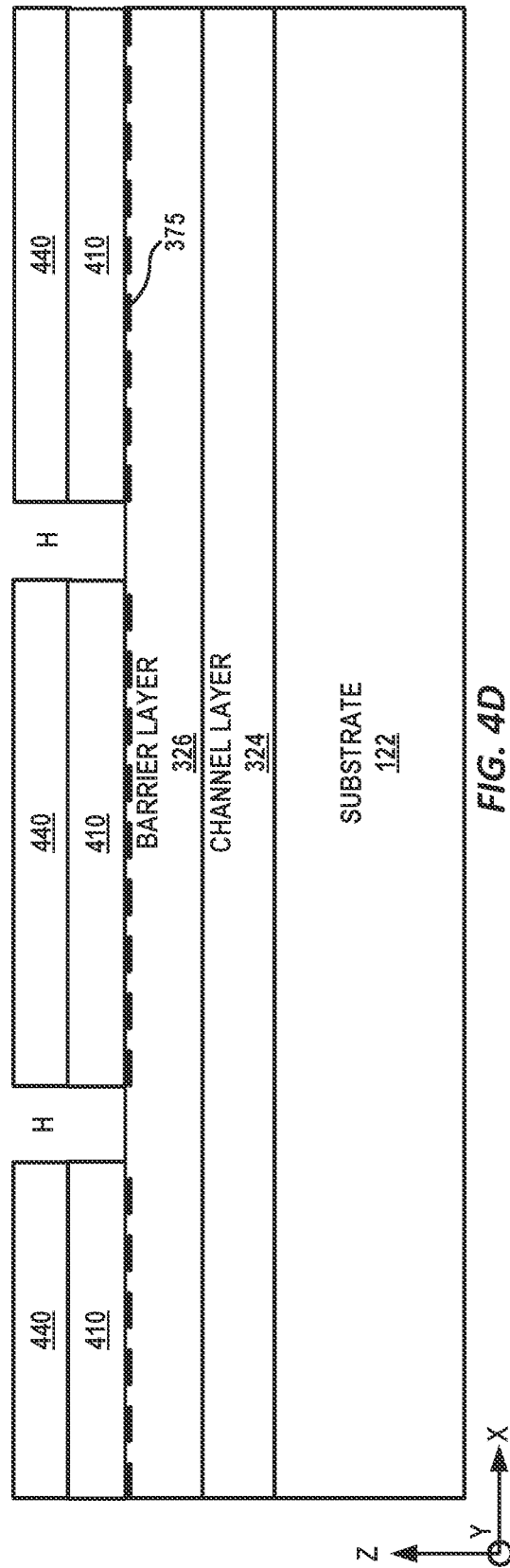
Figure 4I:
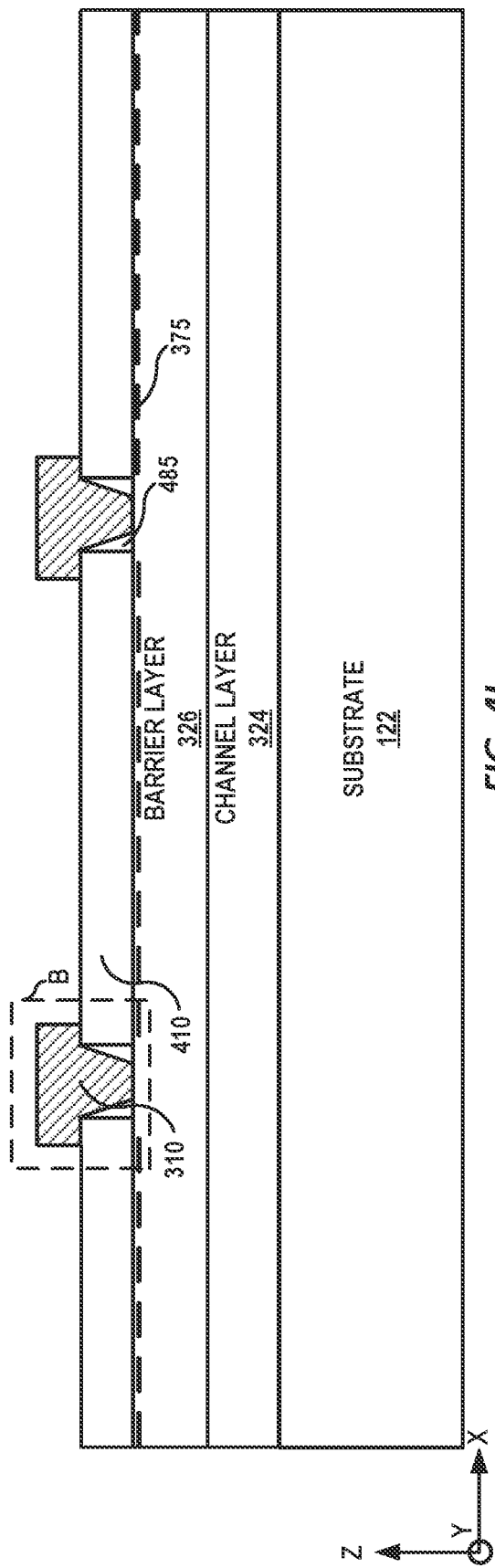
Figure 4J:
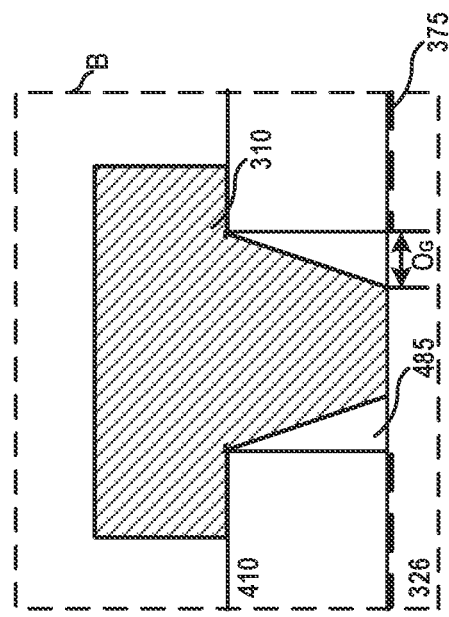
Figure 4K:
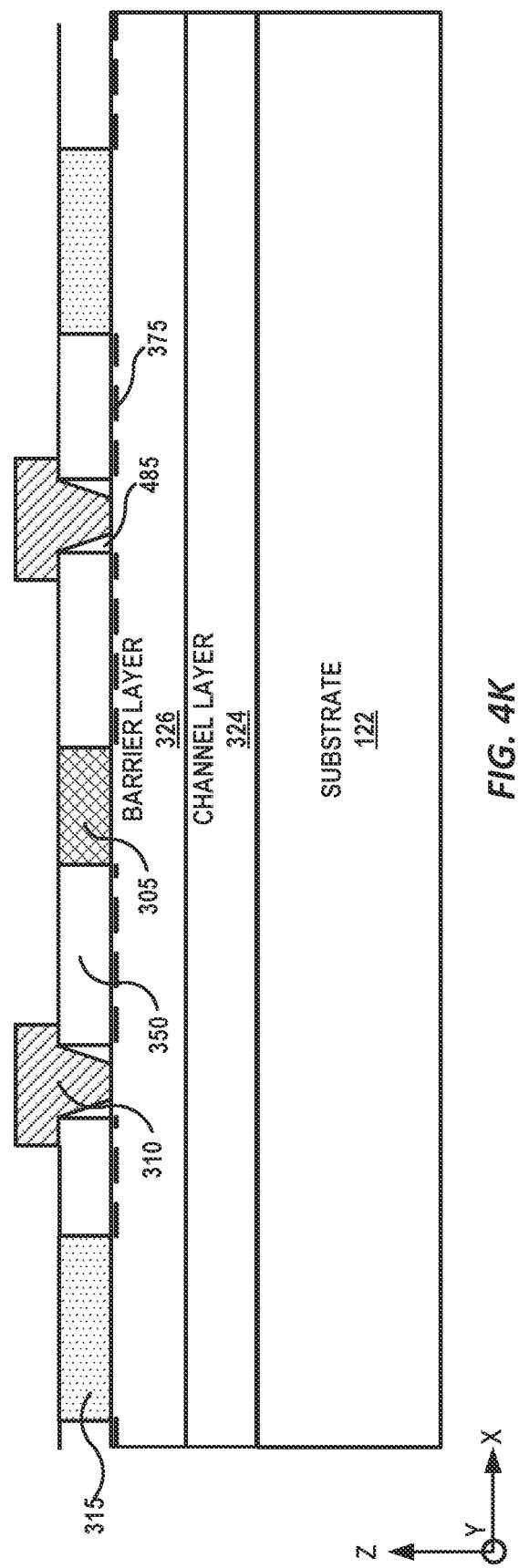
Figure 4L:
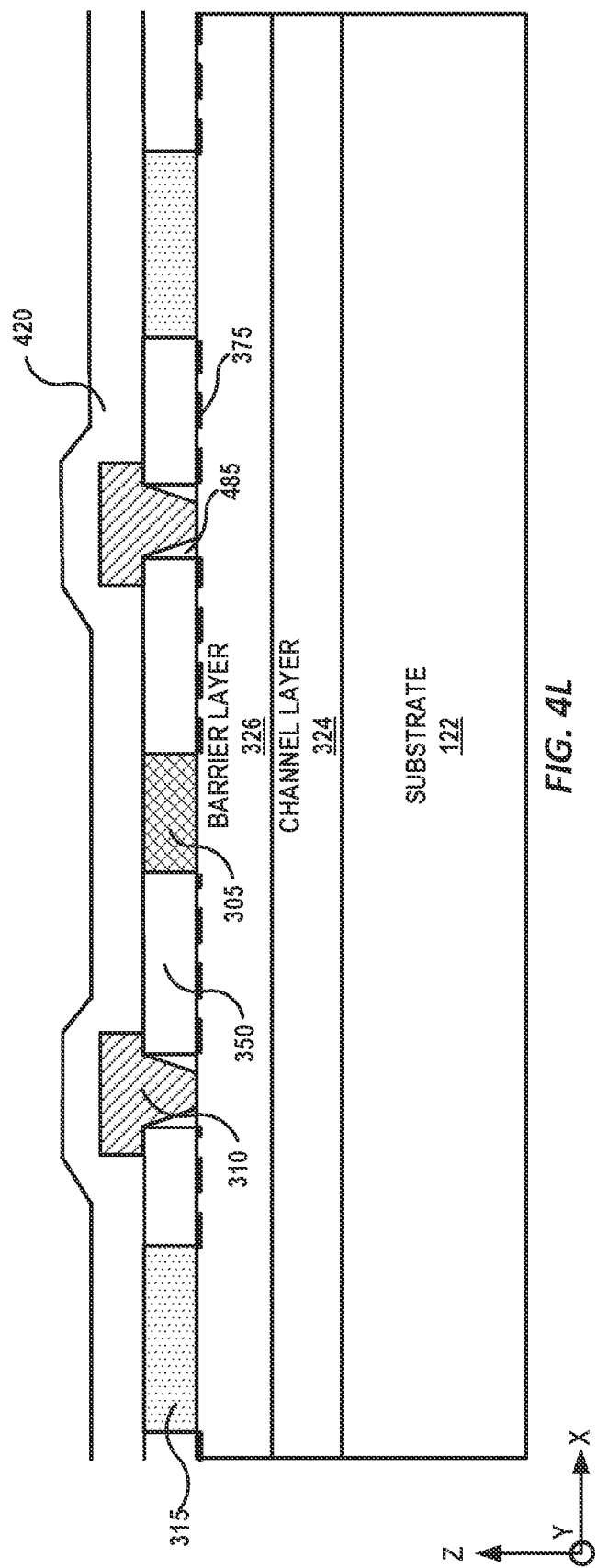
Figure 4M:
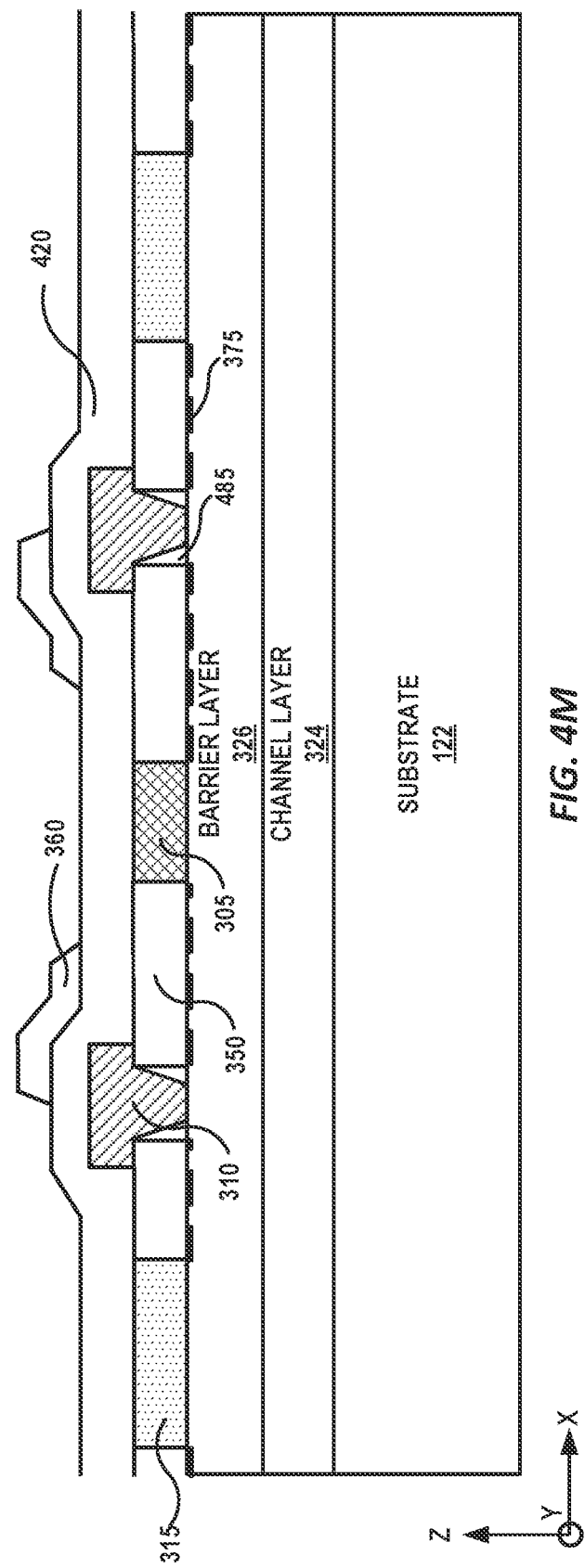
Figure 4N:
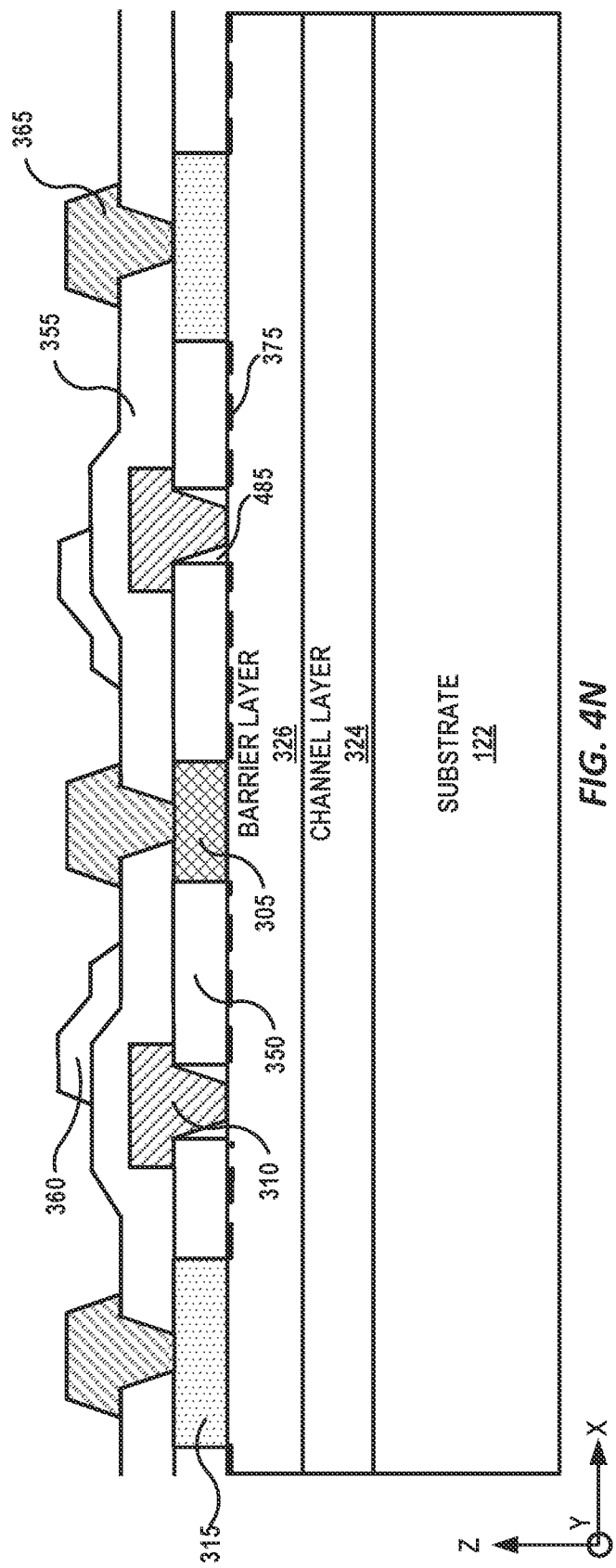
Figure 4O:
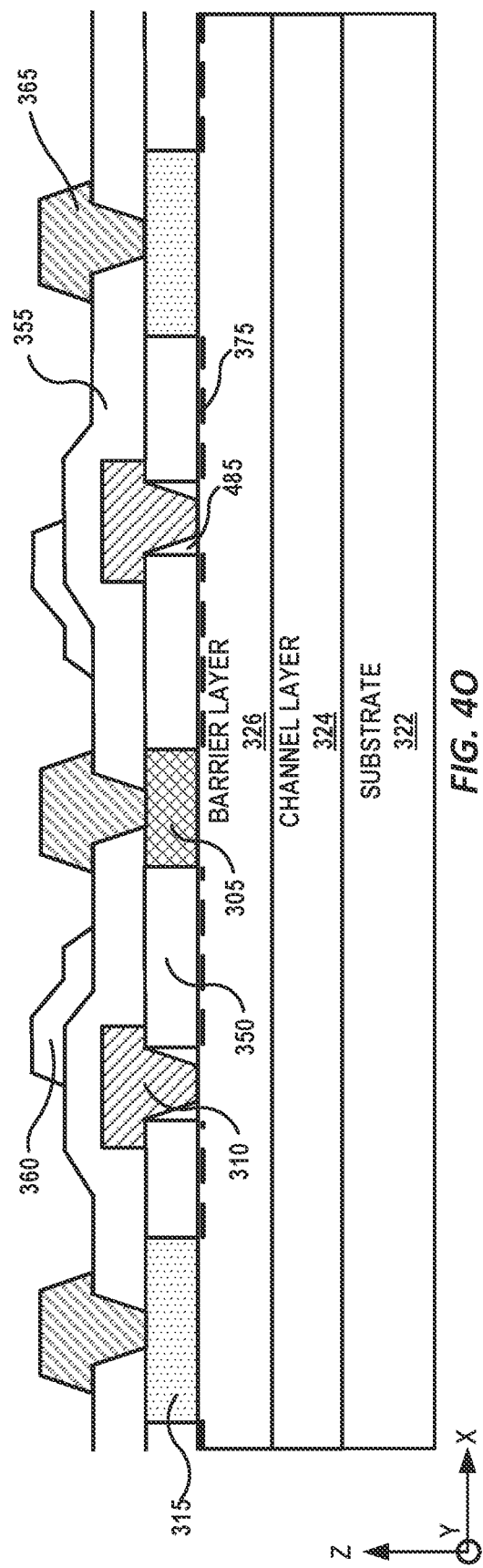
Figure 4P:
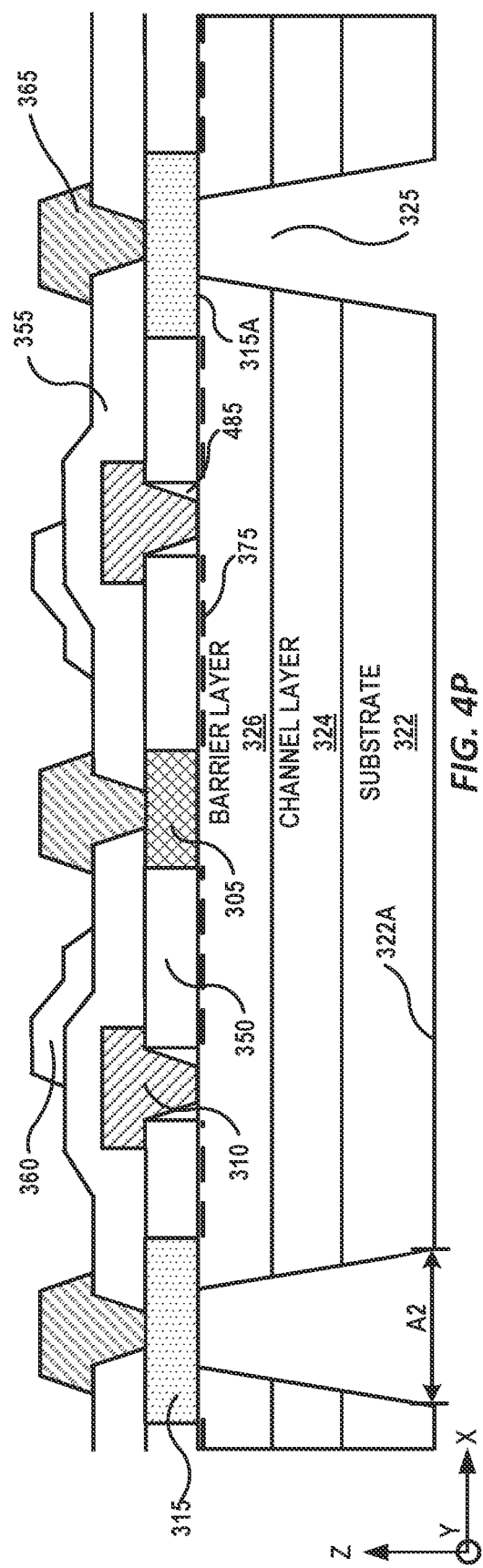
Figure 4Q:
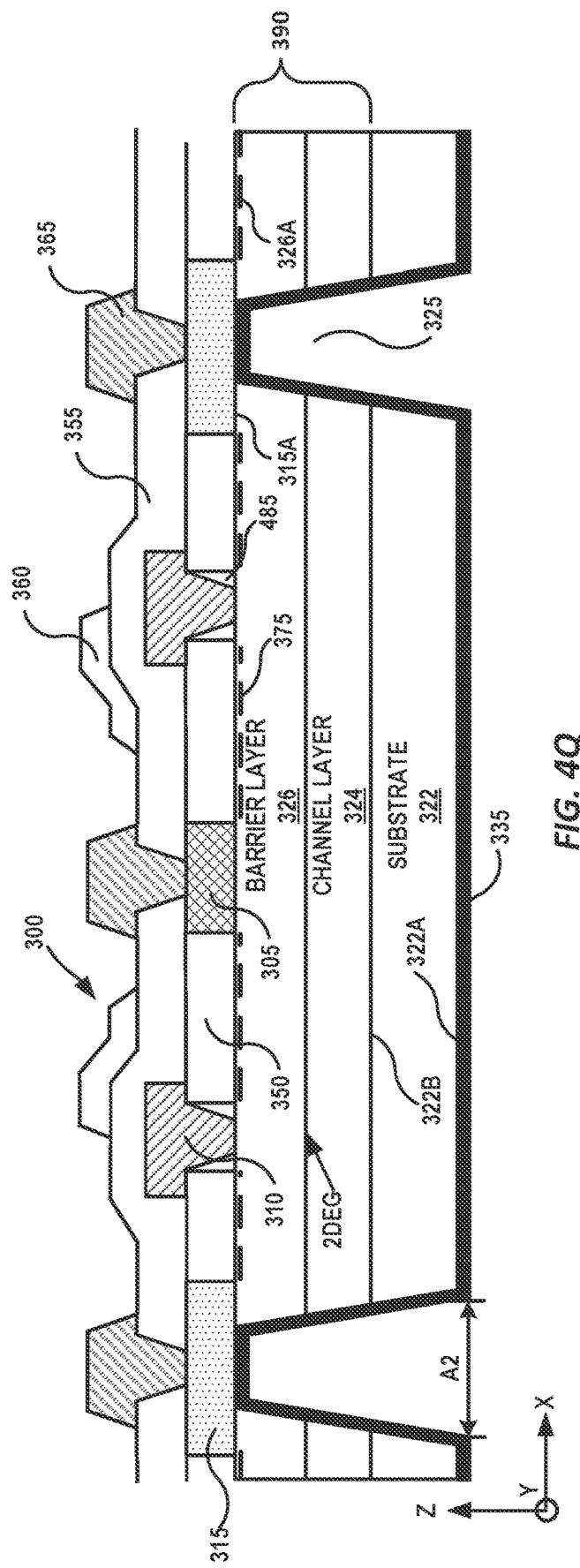

FIGS. 4A to 4Q are schematic cross-sectional view taken along line B-B of FIG. 1 that illustrate a method of fabricating a HEMT device, such as the HEMT device 300 of FIGS. 1 and 2A-2C, according to embodiments of the present disclosure. In FIGS. 4A to 4Q, a process is illustrated in which a gate contact is formed before the drain and source contacts. This is done to provide a clearer explanation of the interface modification process and is not intended to limit the embodiments of the present disclosure. In some embodiments, the source and drain contacts may be fabricated first prior to forming the gate contact.

Referring now to FIG. 4A, a substrate 122 is provided on which a semiconductor structure may be formed. A channel layer 324 is formed on the substrate 122, and a barrier layer 326 is formed on the channel layer 324. The substrate 122 may be a semi-insulating silicon carbide (SiC) substrate that may be, for example, the 4H polytype of silicon carbide. Other silicon carbide candidate polytypes may include the 3C, 6H, and 15R polytypes. A thickness of the substrate 122 may be 100 µm or greater.

Silicon carbide has a much closer crystal lattice match to Group III nitrides (which may be employed in the channel layer 324 and/or the barrier layer 326) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance.

It is to be understood that, although silicon carbide may be employed as a substrate, embodiments of the present invention may utilize any suitable substrate for the substrate 122, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

Optional buffer, nucleation and/or transition layers (not shown) may also be provided on the substrate 122. For example, an AlN buffer layer may be provided to provide an appropriate crystal structure transition between a silicon carbide substrate and the remainder of the device. Additionally, strain balancing transition layer(s) may also be provided.

Still referring to FIG. 4A, a channel layer 324 is provided on the substrate 122. The channel layer 324 may be deposited on the substrate 122 using buffer layers, transition layers, and/or nucleation layers as described above. The channel layer 324 may be under compressive strain. Furthermore, the channel layer 324 and/or buffer, nucleation, and/or transition layers may be deposited by MOCVD, MBE, and/or HVPE. In some embodiments of the present invention, the channel layer 324 may be a Group III-nitride layer.

The barrier layer 326 may be a Group III-nitride layer. In certain embodiments of the present invention, the barrier layer 326 may be a highly-doped n-type layer. For example, the barrier layer 326 may be doped to a concentration of less than about $10^{19}$ cm$^3$.

In some embodiments of the present invention, the barrier layer 326 may have a thickness, Al composition, and/or doping sufficient to induce a significant carrier concentration at the interface between the channel layer 324 and the barrier layer 326 through polarization effects when the barrier layer 326 is buried under ohmic contact metal. Also, the barrier layer 326 may be thick enough to reduce or minimize scattering of electrons in the channel due to ionized impurities deposited at the interface between the barrier layer 326 and a subsequently formed first protective layer.

In some embodiments, the channel layer 324 and the barrier layer 326 may have different lattice constants. For example, the barrier layer 326 may be a relatively thin layer having a smaller lattice constant than the channel layer 324, such that the barrier layer 326 "stretches" at the interface between the two. Accordingly, a pseudomorphic HEMT (pHEMT) device may be provided.

Referring to FIG. 4B, a first passivation layer 410 is formed on the barrier layer 326. The first passivation layer 410 may be dielectric material, such as silicon nitride ($Si_xN_y$), aluminum nitride (AlN), silicon dioxide ($SiO_2$), and/or other suitable protective material. Other materials may also be utilized for the first passivation layer 410. For example, the first passivation layer 410 may also include magnesium oxide, scandium oxide, aluminum oxide and/or aluminum oxynitride. Furthermore, the first passivation layer 410 may be a single layer or may include multiple layers of uniform and/or non-uniform composition.

The first passivation layer 410 may be blanket formed on the barrier layer 326. For example, the first passivation layer 410 may be a silicon nitride (SiN) layer formed by high quality sputtering and/or plasma-enhanced chemical vapor deposition (PECVD). The first passivation layer 410 may be sufficiently thick so as to protect the underlying barrier layer 326 during a subsequent anneal of ohmic contacts.

An interface modification layer 475 may be provided at an interface between the first passivation layer 410 and the barrier layer 326. The interface modification layer 475 provide a variation in conductivity, trap concentration, sheet resistance, and/or surface potential in the lateral direction in the drain access region (and/or source access region) between the gate and the drain (and/or source). The interface modification layer 475 may be provided ex-situ (prior to insertion of the structure into the fabrication environment in which the first passivation layer 410 is formed), in-situ (within the fabrication environment in which the first passivation layer 410 is formed, but prior to the formation of the first passivation layer 410), and/or during the deposition of the first passivation layer.

Examples of in-situ processes that may provide the interface modification layer 475 include ion bombardment of the barrier layer 326, plasma nitridation of the barrier layer 326, plasma oxidation of the barrier layer 326, H2 plasma treatment of the barrier layer 326 (which may induce nitrogen deficiencies or vacancies near the surface of the barrier layer 326), annealing the barrier layer 326 in a chemically active gas environment (which may include, but is not limited to: forming gas, nitric oxide, nitrogen dioxide, and ammonia), and/or annealing the barrier layer 326 in a chemically inert gas environment. In will be understood that each of these techniques may be performed individually or in any combination of the above techniques. In some embodiments, these processes may be performed in a separate process chamber from the deposition chamber, but a vacuum may be maintained prior to moving to the deposition chamber. In some embodiments, these processes may be performed within the deposition chamber itself prior to depositing the passivation.

Examples of ex-situ processes that may provide the interface modification layer 475 include wet etching the surface of the barrier layer 326 in an acidic and/or basic chemical bath. In some embodiments, a buffered oxide etch (BOE) (e.g., buffered HF) may be used. In some embodiments, the BOE may be neutral, but could still be used to remove native oxides, which may be advantageous in some applications.

Examples of processes that may be used during the formation of the first passivation layer 410 to provide the interface modification layer 475 include the use of physical vapor deposition (PVD) to form the first passivation layer 410, the use of plasma enhanced chemical vapor deposition (PECVD) to form the first passivation layer 410, the use of atomic layer deposition (ALD) to form the first passivation layer 410, the use of plasma enhanced atomic layer deposition (PEALD) to form the first passivation layer 410, and/or the use of thermolytic deposition to form the first passivation layer 410. In some embodiments one or more of the above deposition techniques may be used in any combination or subcombination to form the first passivation layer 410 as a multi-layer stack. In some embodiments, the deposition techniques may be used alone or with one or more of the in-situ and/or ex-situ processes to provide the interface modification layer 475.

Other processes may be used after the formation of the first passivation layer 410. For example, methods that may provide an interface modification layer 475 after the first passivation layer 410 has been deposited may include modifications and/or processes that etch and/or otherwise remove portions of the first passivation layer 410 to provide access to the interface between the first passivation layer 410 and the barrier layer 326. Such methods are discussed, for example, in commonly assigned U.S. patent application Ser. No. 17/325,488, the disclosure of which is incorporated herein by reference as if set forth fully herein.

Referring to FIG. 4C, a mask 440 may be formed on the first passivation layer 410. The mask 440 may include holes H which are positioned at locations of the gate contacts.

Referring to FIG. 4D, an etch (e.g., an anisotropic etch) may be performed using the mask 440. The etch may remove portions of the first passivation layer 410 exposed by the holes H in the mask 440 to expose the barrier layer 326. The etch may also remove portions of interface modification layer 475 at the interface between the removed portions of the first passivation layer 410 and the barrier layer 326. For example, the etch may remove portions of the barrier layer 326 and/or first passivation layer 410 containing the interface modifications provided in earlier processes (e.g., FIG. 4B). In some embodiments, the exposure of the barrier layer 326 to the atmosphere by the etching process may remove and/or modify the characteristics of the interface modification layer 475 in the etched regions. The etch of the interface modification layer 475 may form the modified interface region 375. As a result of the modified interface region 375, a sheet resistance of the source access region and/or the drain access region of the device 300 may be between 300 to 400 Ω/sq.

Referring to FIG. 4E, the mask 440 may be removed, exposing first passivation layer 410 and portions of the surface of the barrier layer 326 that are within the etched holes H in the first passivation layer 410.

Referring to FIG. 4F, a spacer layer 445 may be conformally formed on the first passivation layer 410 and the portions of the surface of the barrier layer 326 that are within the etched holes H in the first passivation layer 410. In some embodiments, the spacer layer 445 may be a same or similar material as the first passivation layer 410. For example, spacer layer 445 may be dielectric material, such as silicon nitride ($Si_xN_y$), aluminum nitride (AlN), silicon dioxide ($SiO_2$), and/or other suitable protective material. For example, the spacer layer 445 may also include magnesium oxide, scandium oxide, aluminum oxide and/or aluminum oxynitride. Furthermore, the spacer layer 445 may be a single layer or may include multiple layers of uniform and/or non-uniform composition.

The spacer layer 445 may be blanket formed on the first passivation layer 410 and the barrier layer 326. For example, the spacer layer 445 may be a silicon nitride (SiN) layer formed by high quality sputtering and/or plasma-enhanced chemical vapor deposition (PECVD). Due to the holes etched into the first passivation layer 410, a height of the spacer layer 445 on portions of the upper surface of the first passivation layer 410 may be higher than a height of the spacer layer 445 on the upper surface of the barrier layer 326 within the holes etched in the first passivation layer 410. As will be understood by one of ordinary skill of the art, the formation of the spacer layer 445 on the first passivation layer 410 may provide a distinct interface that may be detected in the finalized device, even if the spacer layer 445 and the first passivation layer 410 are formed of a same material.

In some embodiments, the spacer layer 445 may be formed so as to have an interface modification with respect to the barrier layer 326 that is different than the modified interface region 375. For example, the deposition process used to form the spacer layer 445 may include the use of PVD, PECVD, ALD, PEALD, and/or other thermolytic deposition technique. In some embodiments one or more of the above deposition techniques may be used in any combination or subcombination to form the spacer layer 445 as a multi-layer stack. In some embodiments, ex-situ and/or in-situ processes may be used during the formation of the spacer layer 445 such as those discussed herein with respect to the formation of the interface modification layer 475 (e.g., FIG. 4B).

For example, the process used to form the spacer layer 445 may include ion bombardment of the barrier layer 326, plasma nitridation of the barrier layer 326, plasma oxidation of the barrier layer 326, H2 plasma treatment of the barrier layer 326 (which may induce nitrogen deficiencies or vacancies near the surface of the barrier layer 326), annealing the barrier layer 326 in a chemically active gas environment (which may include, but is not limited to: forming gas, nitric oxide, nitrogen dioxide, and ammonia), and/or annealing the barrier layer 326 in a chemically inert gas environment. In some embodiments, the process used to form the spacer layer 445 may include wet etching the surface of the barrier layer 326 in an acidic and/or basic chemical bath and/or the use of a BOE.

Referring to FIGS. 4G and 4H, an etch 480 (e.g., an anisotropic etch 480) may be performed on the spacer layer 445. The etch 480 may expose portions of the barrier layer 326 through holes H in the first passivation layer 410. In addition, portions of the prior spacer layer 445 may remain as spacers 485. The spacer layer 445 may be anisotropically etched such that sidewalls of the remaining spacers 485 are inclined with respect to a top surface of the barrier layer 326. The shape of the spacers 485 in FIG. 4H are merely an example, and not intended to limit the embodiments of the disclosure. As illustrated in FIG. 4H, a bottom surface of the spacer 485 may laterally extend from the first passivation layer 410, covering a portion of the barrier layer 326 exposed by the etched holes H in the first passivation layer 410.

Referring to FIG. 4I, a gate contact 310 may be formed in the holes H in the first passivation layer 410. The gate contacts 310 may be formed within the etched holes H, and may extend through the first passivation layer 410 to contact the exposed portion of the barrier layer 326. Suitable gate materials may depend on the composition of the barrier layer 326. However, in certain embodiments, conventional materials capable of making a Schottky contact to a nitride based semiconductor material may be used, such as Ni, Pt, $NiSi_x$, Cu, Pd, Cr, TaN, W, and/or WSiN. Portion of the gate contacts 310 may extend on a surface of the first passivation layer 410.

FIG. 4J is a magnified view of area B of FIG. 4J. Referring to FIG. 4J, the gate contact 310 may be formed on upper surfaces of the barrier layer 326 and the first passivation layer, and on side surfaces of the spacers 485. The presences of the spacers 485 may laterally offset the bottom of the gate contact 310 from the first passivation layer 410 by an offset $O_G$. As a result of the offset $O_G$, the modified interface region 375 of the first passivation layer 410 may be offset from a bottom portion/corner of the gate contact 310 by the offset $O_G$. In some embodiments, the offset $O_G$ may be from between 10 nm and 400 nm. As discussed herein, in some embodiments, a portion of the spacer 485 may have an interface modification of its own that is different from the modified interface region 375 of the first passivation layer 410.

Referring to FIG. 4K, the first passivation layer 410 (see FIG. 4I) may be patterned to form source contacts 315 and drain contacts 305. For example, the first passivation layer 410 may be patterned to form windows which expose the barrier layer 326 for placement of the source contact 315 and the drain contacts 305. The windows may be etched utilizing a patterned mask and a low-damage etch with respect to the barrier layer 326. Ohmic metal may be formed on the exposed portions of the barrier layer 326. The ohmic metal may be annealed to provide the source contacts 315 and the drain contacts 305. The formation of the source contacts 315, gate contacts 310, and drain contacts 305 may result in the patterning of the first passivation layer 410 of FIG. 4I to form the first insulating layer 350.

As previously discussed, in some embodiments, the source contacts 315 and drain contacts 305 may be formed prior to forming the gate contact 310. For example, the first passivation layer 410 of FIG. 4B could be patterned to form the source contacts 315 and drain contacts 305 as described with respect to FIG. 4K, and then the gate contact 310 could be formed as described with respect to FIGS. 4C to 4J.

Though the source contact 315 is illustrated as being on the top surface of the barrier layer 326 in FIG. 4K, it will be understood that the source contacts 315, gate contacts 310, and/or drain contacts 305 may be formed within recesses in the top surface of the barrier layer 326.

Referring to FIG. 4L, a second passivation layer 420 may be formed on the first insulating layer 350, the source contacts 315, gate contacts 310, and drain contacts 305. The second passivation layer 420 may be a dielectric layer. In some embodiments, the second passivation layer 420 may have a different dielectric index than the first insulating layer 350.

Referring to FIG. 4M, field plates 360 may be formed on the second passivation layer 420. The field plate 360 may overlap the gate contact 310 (e.g., in the Z direction of FIG. 4M) and may extend a distance on the region between the gate and the drain (i.e., the gate-drain region). An overlap of the field plate 360 over the gate contact 310 and the distance the field plate 360 extends on the gate-drain region can be varied for optimum results. In some embodiments, the field plate 360 can be electrically connected to gate contact 310, and it is understood that field plate structures other than those illustrated in the figures may be used without deviating from the invention.

Referring to FIG. 4N, the second passivation layer 420 may be patterned to form the metal contacts 365. For example, the second passivation layer 420 may be patterned to form windows which expose the source contacts 315 and/or the drain contacts 305 for placement of the metal contacts 365. The windows may be etched utilizing a patterned mask and a low-damage etch with respect to the source contacts 315 and/or the drain contacts 305. Conductive metal may be formed on the exposed portions of the source contacts 315 and/or the drain contacts 305 to form the metal contacts 365. The formation of the metal contacts 365 may result in the patterning of the second passivation layer 420 of FIG. 4L to form the second insulating layer 355.

Referring to FIG. 4O, the substrate 122 (see FIG. 4N) may be thinned to form the thinned substrate 322. In some embodiments, the thickness of the substrate 322 is reduced using a grinder, such as an in-feed or creep feed grinder. In other embodiments, the thickness of the substrate 322 is reduced using lapping, chemical or reactive ion etching or combinations of these approaches with or without grinding. In still other embodiments, etching may be used to treat the backside of the substrate 322 to reduce damage to the substrate 322 that may result from the thinning operation. Methods of thinning a wafer are described, for example, in commonly assigned U.S. Pat. Nos. 7,291,529; 7,932,111; 7,259,402; and 8,513,686, the disclosures of which are incorporated herein by reference in their entirety.

In some embodiments according to the disclosure, the substrate 322 is thinned to a thickness of between about 40 µm to about 100 µm. In other embodiments, the substrate 322 is thinned to a thickness of between about 40 µm to about 75 µm.

Referring to FIG. 4P, via 325 may be formed in the substrate 322, the channel layer 324 and the barrier layer 326. The via 325 may be formed by wet or dry etching. In some embodiments, the via 325 may be anisotropically etched such that sidewalls of the via 325 are inclined with respect to a top surface of the substrate 322. The via 325 may expose a bottom surface of the ohmic portion 315A of the source contact 315. In some embodiments, the source contact 315 may serve as an etch stop material during the formation of the via 325.

Due to the anisotropic etching, a largest cross-sectional area A2 of the via 325 may be at that portion of the via 325 that is adjacent the lower surface 322A of the substrate 322 (e.g., the opening of the via 325). In some embodiments, the anisotropic etching may result in the largest cross-sectional area A2 of the via being related to a thickness of the substrate 322, as thicker substrates 322 may result in wider openings of the via 325. Thus, thinning the substrate 322, as described with respect to FIG. 4G, may result in additional benefits due to the reduction of the cross-sectional area A2 of the via 325.

Referring to FIG. 4Q, after formation of the via 325, backmetal layer 335 may be deposited on the lower surface 322A of the substrate 322, sidewalls of the via 325, and the bottom surface of the ohmic portion 315A of the source contact 315. Thus, the backmetal layer 335 may directly contact ohmic portions of the source contact 315. The backmetal layer 335 may include a conductive metal such as, for example, titanium, platinum, and/or gold.

Figure 5A:
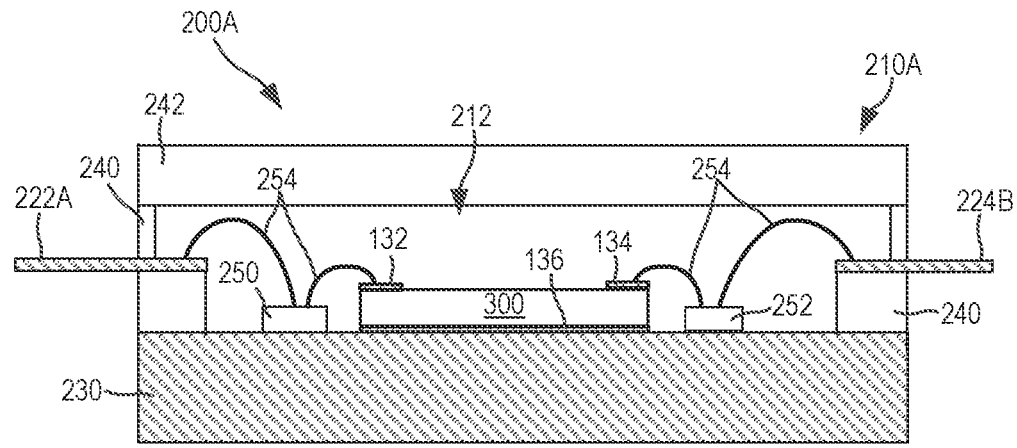
FIGS. 5A through 5C are schematic cross-sectional views illustrating several example ways that that the HEMT devices according to embodiments of the present disclosure may be packaged to provide packaged RF transistor amplifiers.
Figure 5B:
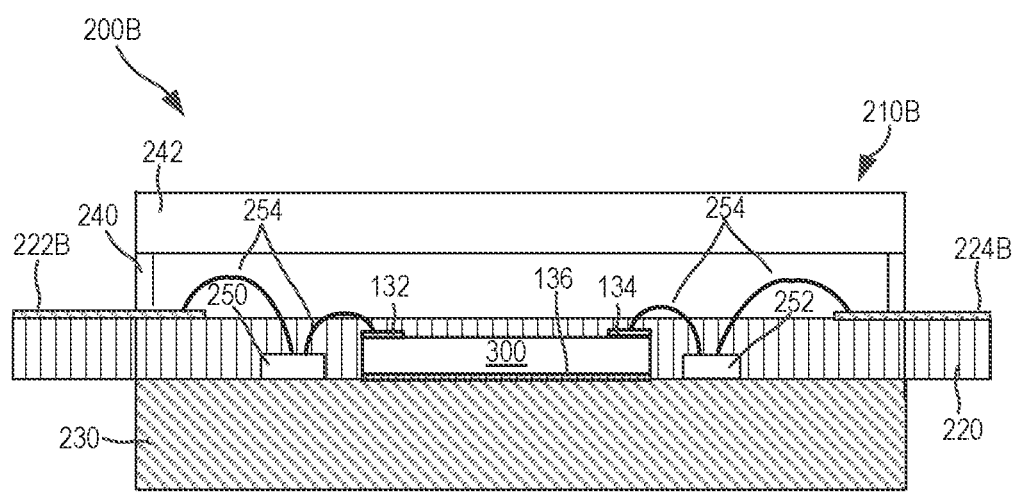
Figure 5C:
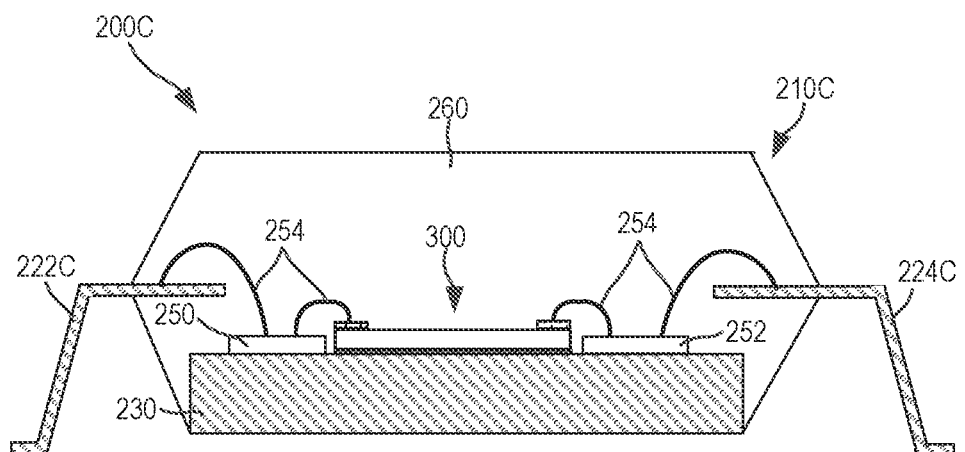

FIGS. 5A through 5C are schematic cross-sectional views illustrating several example ways that that the HEMT device 300 according to embodiments of the present disclosure may be packaged to provide packaged transistor amplifiers 200A through 200C, respectively. While FIGS. 5A-5C show the HEMT device 300 of FIGS. 1 and 2A-2C being packaged, it will be appreciated that any of the HEMT devices according to embodiments of the present disclosure may be packaged in the packages illustrated in FIGS. 5A-5C.

FIG. 5A is a schematic side view of a packaged Group III nitride-based transistor amplifier 200A. As shown in FIG. 5A, packaged transistor amplifier 200A includes the HEMT device 300 packaged in an open cavity package 210A. The package 210A includes metal gate leads 222A, metal drain leads 224A, a metal submount 230, sidewalls 240 and a lid 242.

The submount 230 may include materials configured to assist with the thermal management of the package 200A. For example, the submount 230 may include copper and/or molybdenum. In some embodiments, the submount 230 may be composed of multiple layers and/or contain vias/interconnects. In an example embodiment, the submount 230 may be a multilayer copper/molybdenum/copper metal flange that comprises a core molybdenum layer with copper cladding layers on either major surface thereof. In some embodiments, the submount 230 may include a metal heat sink that is part of a lead frame or metal slug. The sidewalls 240 and/or lid 242 may be formed of or include an insulating material in some embodiments. For example, the sidewalls 240 and/or lid 242 may be formed of or include ceramic materials. In some embodiments, the sidewalls 240 and/or lid 242 may be formed of, for example, $Al_2O_3$. The lid 242 may be glued to the sidewalls 240 using an epoxy glue. The sidewalls 240 may be attached to the submount 230 via, for example, brazing. The gate lead 222A and the drain lead 224A may be configured to extend through the sidewalls 240, though embodiments of the present invention are not limited thereto.

The HEMT device 300 is mounted on the upper surface of the metal submount 230 in an air-filled cavity 212 defined by the metal submount 230, the ceramic sidewalls 240 and the ceramic lid 242. As described above, the gate and drain terminals 132, 134 of the HEMT device 300 are on the top side of the semiconductor structure 390, while the source terminal 136 is on the bottom side of the semiconductor structure 390. The source terminal 136 may be mounted on the metal submount 230 using, for example, a conductive die attach material (not shown). The metal submount 230 may provide the electrical connection to the source terminal 136 and may also serve as a heat dissipation structure that dissipates heat that is generated in the HEMT device 300. The heat is primarily generated in the upper portion of the HEMT device 300 where relatively high current densities are generated in, for example, the channel regions of the unit cell transistors 300_A, 300_B. This heat may be transferred though the source vias 325 and the semiconductor structure 390 to the source terminal 136 and then to the metal submount 230.

Input matching circuits 250 and/or output matching circuits 252 may also be mounted within the package 210. The matching circuits 250, 252 may include impedance matching and/or harmonic termination circuits. The impedance matching circuits may be used to match the impedance of the fundamental component of RF signals that are input to or output from the transistor amplifier 200A to the impedance at the input or output of the HEMT device 300, respectively. The harmonic termination circuits may be used to ground harmonics of the fundamental RF signal that may be present at the input or output of the HEMT device 300. More than one input matching circuit 250 and/or output matching circuit 252 may be provided. As schematically shown in FIG. 5A, the input and output matching circuits 250, 252 may be mounted on the metal submount 230. The gate lead 222A may be connected to the input matching circuit 250 by one or more bond wires 254, and the input matching circuit 250 may be connected to the gate terminal 132 of HEMT device 300 by one or more additional bond wires 254. Similarly, the drain lead 224A may be connected to the output matching circuit 252 by one or more bond wires 254, and the output matching circuit 252 may be connected to the drain terminal 134 of HEMT device 300 by one or more additional bond wires 254. The bond wires 254, which are inductive elements, may form part of the input and/or output matching circuits 250, 252.

FIG. 5B is a schematic side view of a packaged Group III nitride-based transistor amplifier 200B that includes the HEMT device 300 of FIGS. 1 and 2A-2C packaged in a printed circuit board based package 210B. The packaged transistor amplifier 200B is very similar to the packaged transistor amplifier 200A of FIG. 5A, except that the gate and drain leads 222A, 224A of package 210A are replaced with printed circuit board based leads 222B, 224B in package 210B.

The package 210B includes a submount 230, ceramic sidewalls 240, a ceramic lid 242, each of which may be substantially identical to the like numbered elements of package 210A discussed above. The package 210B further includes a printed circuit board 220. Conductive traces on the printed circuit board 220 form a metal gate lead 222B and a metal drain lead 224B. The printed circuit board 220 may be attached to the submount 230 via, for example, a conductive glue. The printed circuit board 230 includes a central opening and the HEMT device 300 is mounted within this opening on the submount 230. Other components of transistor amplifier 200B may be the same as the like-numbered components of transistor amplifier 200A, and hence further description thereof will be omitted.

FIG. 5C is a schematic side view of another packaged Group III nitride-based transistor amplifier 200C. Transistor amplifier 200C differs from transistor amplifier 200A in that it includes a different package 210C. The package 210C includes a metal submount 230 (which may be similar or identical to the like numbered submount 230 of package 210A), as well as metal gate and drain leads 222C, 224C. Transistor amplifier 200C also includes a plastic overmold 260 that at least partially surrounds the HEMT device 300, the leads 222C, 224C, and the metal submount 230. Other components of transistor amplifier 200C may be the same as the like-numbered components of transistor amplifier 200A and hence further description thereof will be omitted.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims

What is claimed is:

1. A method of forming a high electron mobility transistor (HEMT), comprising:
    providing a semiconductor structure comprising a channel layer and a barrier layer sequentially stacked on a substrate;
    forming a first insulating layer on the barrier layer; and
    forming a gate contact, a source contact, and a drain contact on the barrier layer,
    wherein an interface between the first insulating layer and the barrier layer comprises a modified interface region on a drain access region and/or a source access region of the semiconductor structure such that a sheet resistance of the drain access region and/or the source access region is between 300 and 400 Ω/sq.

2. The method of claim 1, wherein a bottom surface of the gate contact is laterally offset from the modified interface region by 10 to 400 nm.

3. The method of claim 1, wherein forming the first insulating layer on the barrier layer comprises a use of physical vapor deposition (PVD), plasma enhanced chemical vapor deposition (PECVD), atomic layer deposition (ALD), plasma enhanced atomic layer deposition (PEALD), and/or thermolytic deposition.

4. The method of claim 1, further comprising wet etching an upper surface of the barrier layer in an acidic and/or basic chemical bath prior to forming the first insulating layer.

5. The method of claim 1, further comprising, prior to forming the first insulating layer, performing an ion bombardment of the barrier layer, performing a plasma nitridation of the barrier layer, performing a plasma oxidation of the barrier layer, performing an H2 plasma treatment of the barrier layer, and/or annealing the barrier layer in a gas environment.

6. The method of claim 1, further comprising forming a spacer between the modified interface region and the gate contact.

7. The method of claim 6, wherein forming the spacer comprises:
    etching a hole in the first insulating layer; and
    forming the spacer on a sidewall of the hole and on the barrier layer,
    wherein forming the gate contact comprises forming at least a portion of the gate contact on a sidewall of the spacer in the hole.

8. The method of claim 6, wherein an interface between the spacer and the barrier layer comprises an interface characteristic that is different from the modified interface region.

9. A method of forming a high electron mobility transistor (HEMT), comprising:
    providing a semiconductor structure comprising a channel layer and a barrier layer sequentially stacked on a substrate;
    forming a first insulating layer on the barrier layer;
    forming a gate contact on the barrier layer, at least a portion of the gate contact within the first insulating layer; and
    providing a modified interface region between the first insulating layer and the barrier layer that is laterally separated from a bottom surface of the gate contact.

10. The method of claim 9, wherein the modified interface region is laterally separated from the bottom surface of the gate contact by 10 to 400 nm.

11. The method of claim 9, further comprising:
    etching a hole in the first insulating layer; and
    forming a spacer on a sidewall of the hole and on the barrier layer,
    wherein forming the gate contact comprises forming at least a portion of the gate contact on a sidewall of the spacer in the hole.

12. The method of claim 11, wherein an interface between the spacer and the barrier layer comprises a trap concentration that is different from a trap concentration of the modified interface region.

13. The method of claim 9, wherein providing the modified interface region comprises, prior to forming the first insulating layer, wet etching an upper surface of the barrier layer in an acidic and/or basic chemical bath, performing an ion bombardment of the barrier layer, performing a plasma nitridation of the barrier layer, performing a plasma oxidation of the barrier layer, performing an H2 plasma treatment of the barrier layer, and/or annealing the barrier layer in a gas environment.

14. The method of claim 9, wherein a thickness of the first insulating layer is between 80 nm and 120 nm.

15. The method of claim 9, wherein a sheet resistance of a drain access region and/or a source access region of the semiconductor structure beneath the modified interface region is between 300 and 400 Ω/sq.

16. A method of forming a high electron mobility transistor (HEMT), comprising:
    providing a semiconductor structure comprising a channel layer on a substrate and a barrier layer on the channel layer;
    forming a first insulating layer on the barrier layer and etching an opening in the first insulating layer, the first insulating layer comprising a modified interface region in an interface between the first insulating layer and the barrier layer;

forming a spacer on the barrier layer in the opening in the first insulating layer; and forming a gate contact on the barrier layer and the spacer in the opening in the first insulating layer, wherein an interface between the spacer and the barrier layer comprises a trap concentration and/or surface potential that is different from a trap concentration and/or surface potential of the modified interface region.

17. The method of claim 16, further comprising thinning the substrate.

18. The method of claim 16, wherein a bottom corner of the gate contact is offset from the modified interface region by the spacer.

19. The method of claim 16, wherein a thickness of the first insulating layer is between 80 nm and 120 nm.

20. The method of claim 16, wherein a width of a bottom surface of the spacer that is adjacent the barrier layer is 10 to 400 nm.

21. The method of claim 16, wherein forming the first insulating layer comprising the modified interface region comprises:

wet etching an upper surface of the barrier layer in an acidic and/or basic chemical bath, performing a buffered oxide etch (BOE) of the upper surface of the barrier layer, performing an ion bombardment of the barrier layer, performing a plasma nitridation of the barrier layer, performing a plasma oxidation of the barrier layer, performing an H2 plasma treatment of the barrier layer, and/or annealing the barrier layer in a gas environment; and depositing a passivation layer on the barrier layer.

* * * * *

UNITED STATES PATENT AND TRADEMARK OFFICE
CERTIFICATE OF CORRECTION

PATENT NO. : 12,015,075 B2
APPLICATION NO. : 17/325628
DATED : June 18, 2024
INVENTOR(S) : Bothe et al.

It is certified that error appears in the above-identified patent and that said Letters Patent is hereby corrected as shown below:

On the Title Page

(71) Applicant: Please correct "Wolfspeed, Inc., Durham, NC" to read --MACOM Technology Solutions Holdings, Inc., Lowell, MA--

In the Specification:

Column 2, Line 32: Please correct "400 SI/sq." to read --400 Ω/sq.--

Column 6, Line 34: Please correct "HYPE" to read --HVPE--

Column 8, Line 46: Please correct "$F_D$. The distance I'$_D$" to read --$\Gamma_D$. The distance $\Gamma_D$--

Column 10, Line 3: Please correct "400 SZ/sq." to read --400 Ω/sq.--

Column 13, Line 22: Please correct "$10^{19}$ cm$^3$." to read --$10^{19}$ cm$^{-3}$.--

Signed and Sealed this
Tenth Day of September, 2024

Katherine Kelly Vidal
*Director of the United States Patent and Trademark Office*